United States Patent
Johnson et al.

(10) Patent No.: US 7,790,596 B2
(45) Date of Patent: Sep. 7, 2010

(54) APPARATUS AND METHOD FOR SEMICONDUCTOR WAFER BUMPING VIA INJECTION MOLDED SOLDER

(75) Inventors: Hale Johnson, Jericho, VT (US); Wilhelm Lapointe, Richmond, VT (US)

(73) Assignee: Suss Microtec AG, Garching/Munich (DE)

( * ) Notice: Subject to any disclaimer, the term of this patent is extended or adjusted under 35 U.S.C. 154(b) by 302 days.

(21) Appl. No.: 12/025,845

(22) Filed: Feb. 5, 2008

(65) Prior Publication Data

US 2008/0188070 A1 Aug. 7, 2008

Related U.S. Application Data

(60) Provisional application No. 60/888,137, filed on Feb. 5, 2007.

(51) Int. Cl.
    *H01L 21/00* (2006.01)
(52) U.S. Cl. ............... 438/613; 438/615; 257/E21.476; 257/E21.575; 257/E23.01
(58) Field of Classification Search ......... 438/613–615; 257/E21.476, 575, E23.01
    See application file for complete search history.

(56) References Cited

U.S. PATENT DOCUMENTS

| | | | |
|---|---|---|---|
| 6,119,927 A | | 9/2000 | Ramos et al. |
| 6,344,407 B1 | | 2/2002 | Matsuki et al. |
| 6,666,369 B2 | | 12/2003 | Matsuki et al. |
| 6,717,065 B2 | * | 4/2004 | Hosaka et al. ............... 174/259 |
| 6,805,279 B2 | | 10/2004 | Lee et al. |
| 7,134,199 B2 | | 11/2006 | Su et al. |
| 2006/0035454 A1 | | 2/2006 | Belanger et al. |
| 2006/0043640 A1 | | 3/2006 | Mahmood et al. |
| 2006/0289607 A1 | | 12/2006 | Buchwalter et al. |
| 2007/0099411 A1 | | 5/2007 | Matsui et al. |
| 2007/0246853 A1 | | 10/2007 | Chiey et al. |
| 2008/0188072 A1 | * | 8/2008 | Johnson et al. ............. 438/615 |
| 2009/0072392 A1 | * | 3/2009 | Dang et al. .................. 257/737 |

OTHER PUBLICATIONS

P.A. Gruber et al., "Low-cost wafer bumping," vol. 49 No. 4/5 Jul./Sep. 2005, International Business Machines Corporation.

* cited by examiner

*Primary Examiner*—Michael S Lebentritt
(74) *Attorney, Agent, or Firm*—AKC Patents LLC; Aliki K. Collins

(57) ABSTRACT

An improved apparatus for positioning and aligning a patterned surface of a semiconductor structure directly opposite to solder filled patterned mold cavities of a mold structure includes a pattern based alignment too including means for identifying a mold training pattern image and a semiconductor training pattern image on a training mold structure and a training semiconductor structure, respectively, means for training the alignment tool with the training pattern images, means for storing the alignment tool trained position, means for identifying a mold pattern image and a semiconductor pattern image on the mold structure and the semiconductor structure matching the mold training pattern image and the semiconductor training pattern image, respectively, and means for aligning the identified mold pattern image with the semiconductor pattern image.

12 Claims, 46 Drawing Sheets

*813a*

APPARATUS AND METHOD FOR SEMICONDUCTOR WAFER BUMPING VIA INJECTION MOLDED SOLDER

CROSS REFERENCE TO RELATED CO-PENDING APPLICATIONS

This application claims the benefit of U.S. provisional application Ser. No. 60/888,137 filed Feb. 5, 2007 and entitled "APPARATUS AND METHOD FOR SEMICONDUCTOR WAFER BUMPING VIA INJECTION MOLDED SOLDER", the contents of which are expressly incorporated herein by reference.

FIELD OF THE INVENTION

The present invention relates to an apparatus and a method for semiconductor wafer bumping, and more particularly to an apparatus for aligning a patterned semiconductor surface to solder filled mold cavities of a mold for semiconductor wafer bumping.

BACKGROUND OF THE INVENTION

Injection Molded Solder (IMS) is a process used to produce solder bumps on a semiconductor wafer surface. Referring to FIG. 1, the IMS process 30 includes depositing solder into mold cavities (34), forming a pattern on the semiconductor wafer surface (32), aligning the filled mold cavities with the patterned semiconductor wafer surface and then transferring the solder from the mold cavities to the semiconductor wafer surface (38). Solder bumps are formed in a glass mold plate 82 by injecting molten solder into the etched mold cavities. The etched cavities match the pattern of solder bumps required on the semiconductor wafer surface. The process provides fine pitch placement of the solder bumps in the range of 10 to 500 micrometers separation distance between adjacent solder bumps.

The IMS process has been tested and applied for laboratory scale applications. It is desirable to provide a scale-up process and a high volume manufacturing (HVM) apparatus designed to optimize the high volume manufacturing process. A critical aspect of the scale-up process involves the aligning of the filled mold cavities with the patterned semiconductor surface. It is desirable to provide a reliable, high precision and repeatable positioning of the mold plate relative to the semiconductor wafer.

SUMMARY OF THE INVENTION

In general, in one aspect, the invention features an apparatus for forming solder bumps onto semiconductor structures including equipment for filling patterned mold cavities formed on a first surface of a mold structure with solder, equipment for positioning and aligning a patterned first surface of a semiconductor structure directly opposite to the solder filled patterned mold cavities of the mold structure, a fixture tool for holding and transferring the aligned mold and semiconductor structures together and solder transfer equipment for receiving the fixture tool with the aligned mold and semiconductor structures and transferring the solder from the aligned patterned mold cavities to the aligned patterned semiconductor first surface. The positioning and aligning equipment include at least one motorized alignment pin configured to be aligned with a first fiduciary marker on the mold structure and with a first fiduciary marker on the semiconductor structure and a pattern based alignment tool. The pattern based alignment tool comprises means for identifying a mold training pattern image and a semiconductor training pattern image on a training mold structure and a training semiconductor structure, respectively, means for training the alignment tool with the training pattern images, means for storing the alignment tool trained position, means for identifying a mold pattern image and a semiconductor pattern image on the mold structure and the semiconductor structure matching the mold training pattern image and the semiconductor training pattern image, respectively, and means for aligning the identified mold pattern image with the semiconductor pattern image.

Implementations of this aspect of the invention may include one or more of the following features. The solder transfer equipment includes a wafer heater stack configured to heat the semiconductor structure and a mold heater stack configured to heat the mold structure to a process temperature slightly above the solder's melting point. The fixture tool with the aligned mold and semiconductor structures is inserted between the wafer heater stack and the mold heater stack so that a second surface opposite to the first surface of the substrate is in contact with the wafer heater stack and a second surface opposite to the first surface of the mold structure is in contact with the mold heater stack. A deposition chamber is formed between the wafer heater stack and the mold heater stack by sealing the wafer heater stack and the mold heater stack against the frame. The fixture tool comprises a frame having a central aperture dimensioned to support a substrate and wherein a second surface opposite to the patterned first surface of the semiconductor structure is brought in contact with a first surface of the substrate. The fixture tool further comprises one or more clamp/spacer assemblies arranged symmetrically around the frame, each clamp/spacer assembly comprising a clamp configured to clamp the mold and semiconductor structures together and a spacer configured to be inserted between the first surface of the semiconductor structure and the first surface of the mold structure and thereby to separate the mold and semiconductor structures by a distance equal to the spacer's height.

In general, in another aspect, the invention features an apparatus for positioning and aligning a patterned surface of a first semiconductor structure directly opposite to a patterned surface of a second semiconductor structure including at least one motorized alignment pin configured to be aligned with a first fiduciary marker on the first semiconductor structure and with a first fiduciary marker on the second semiconductor structure and a pattern based alignment tool. The pattern based alignment tool includes means for defining first and second training pattern images on first and second training semiconductor structures, respectively, means for training the alignment tool with the first and second training pattern images, means for locating the training pattern images, means for storing the alignment tool trained position, means for identifying first and second semiconductor pattern images on patterned surfaces of the first and second semiconductor structures matching the first and second training pattern images, respectively, and means for aligning centers of the identified first and second semiconductor pattern images.

Implementations of this aspect of the invention may include one or more of the following features. The means for defining first and second training pattern images on first and second training semiconductor structures include means for defining a target area around a unique pattern of elements and means for defining an area around each element. The means for training the alignment tool comprises an automatic pattern recognition application. The automatic pattern recognition application comprises a Patmax application. The means for locating the training pattern image comprises means for locating the training pattern image position within a semiconductor structure search area, means for counting all elements within the training pattern image and means for locating all elements positions within the training pattern image. The means for identifying the semiconductor pattern images on patterned surfaces of the semiconductor structures matching the training pattern images comprise means for matching pattern areas, number of elements within the pattern areas and position of elements within the pattern areas. The apparatus further includes means for designing a mask image based on the elements' center positions and dimensions and training the alignment tool with a pattern mask image comprising elements masked by the mask image.

In general, in another aspect, the invention features a method for forming solder bumps onto semiconductor structures including filling patterned mold cavities formed on a first surface of a mold structure with solder, positioning and aligning a patterned first surface of a semiconductor structure directly opposite to the solder filled patterned mold cavities of the mold structure, providing a fixture tool for holding and transferring the aligned mold and semiconductor structures together and inserting the fixture tool with the aligned mold and semiconductor structures into solder transfer equipment and transferring the solder from the aligned patterned mold cavities to the aligned patterned semiconductor first surface. The aligning includes aligning at least one motorized alignment pin with a first fiduciary marker on the mold structure and with a first fiduciary marker on the semiconductor structure and performing a pattern based alignment. The pattern based alignment comprises identifying a mold training pattern image and a semiconductor training pattern image on a training mold structure and a training semiconductor structure, respectively, training the alignment tool with the training pattern images, storing the alignment tool trained position, identifying a mold pattern image and a semiconductor pattern image on the mold structure and the semiconductor structure matching the mold training pattern image and the semiconductor training pattern image, respectively, and aligning the identified mold pattern image with the semiconductor pattern image.

In general, in another aspect, the invention features a method for positioning and aligning a patterned surface of a first semiconductor structure directly opposite to a patterned surface of a second semiconductor structure including aligning at least one motorized alignment pin with a first fiduciary marker on the first semiconductor structure and with a first fiduciary marker on the second semiconductor structure and performing a pattern based alignment. The pattern based alignment includes defining first and second training pattern images on first and second training semiconductor structures, respectively, training the alignment tool with the first and second training pattern images, locating the training pattern images, storing the alignment tool trained position, identifying first and second semiconductor pattern images on patterned surfaces of the first and second semiconductor structures matching the first and second training pattern images, respectively, and aligning centers of the identified first and second semiconductor pattern images.

BRIEF DESCRIPTION OF THE DRAWINGS

Referring to the figures, wherein like numerals represent like parts throughout the several views.

DETAILED DESCRIPTION OF THE INVENTION

Figure 1:
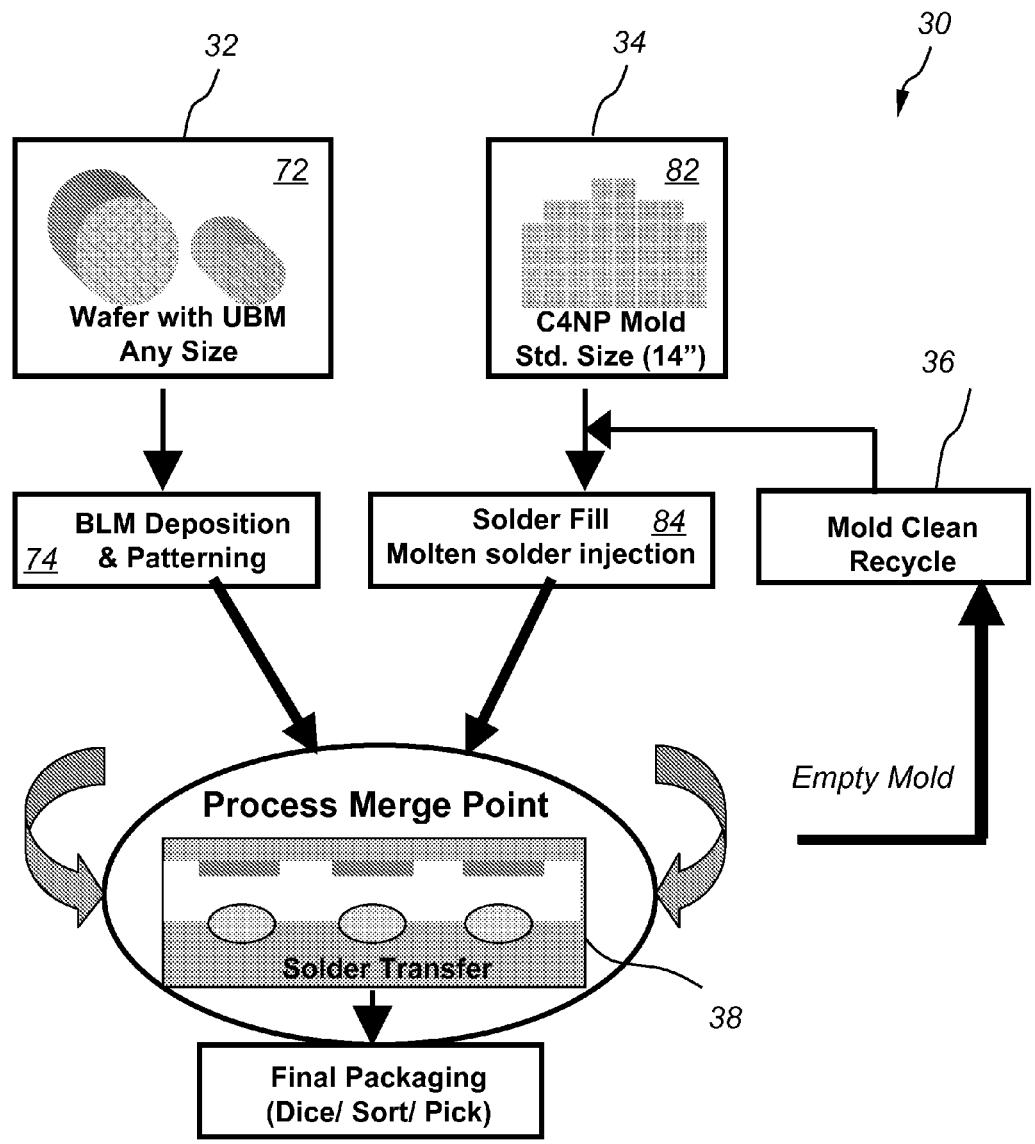
FIG. 1 is a schematic diagram of a laboratory scale Injection Molded Solder (IMS) process.
Figure 2:
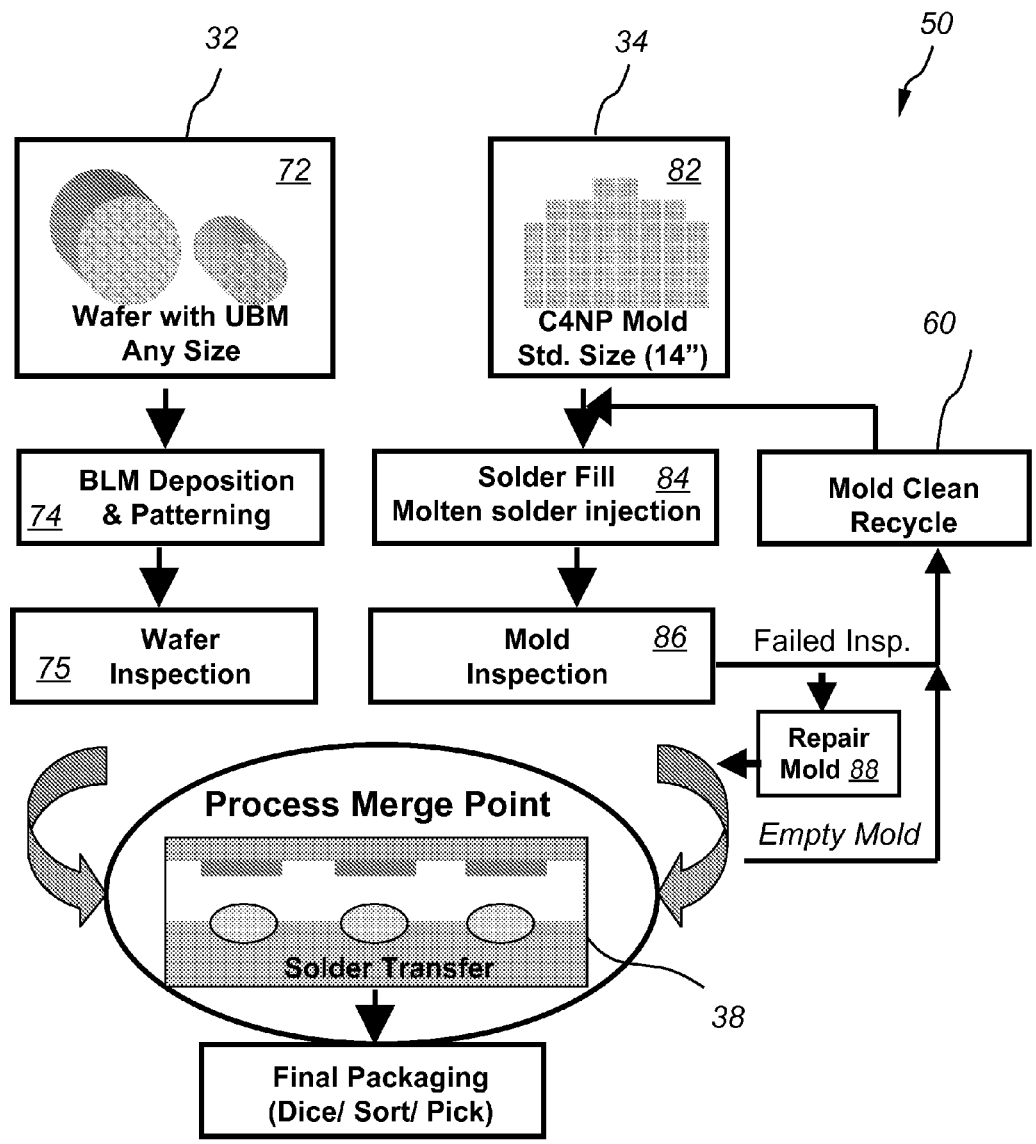
FIG. 2 is a schematic diagram of a scale-up IMS process according to this invention.
Figure 3:
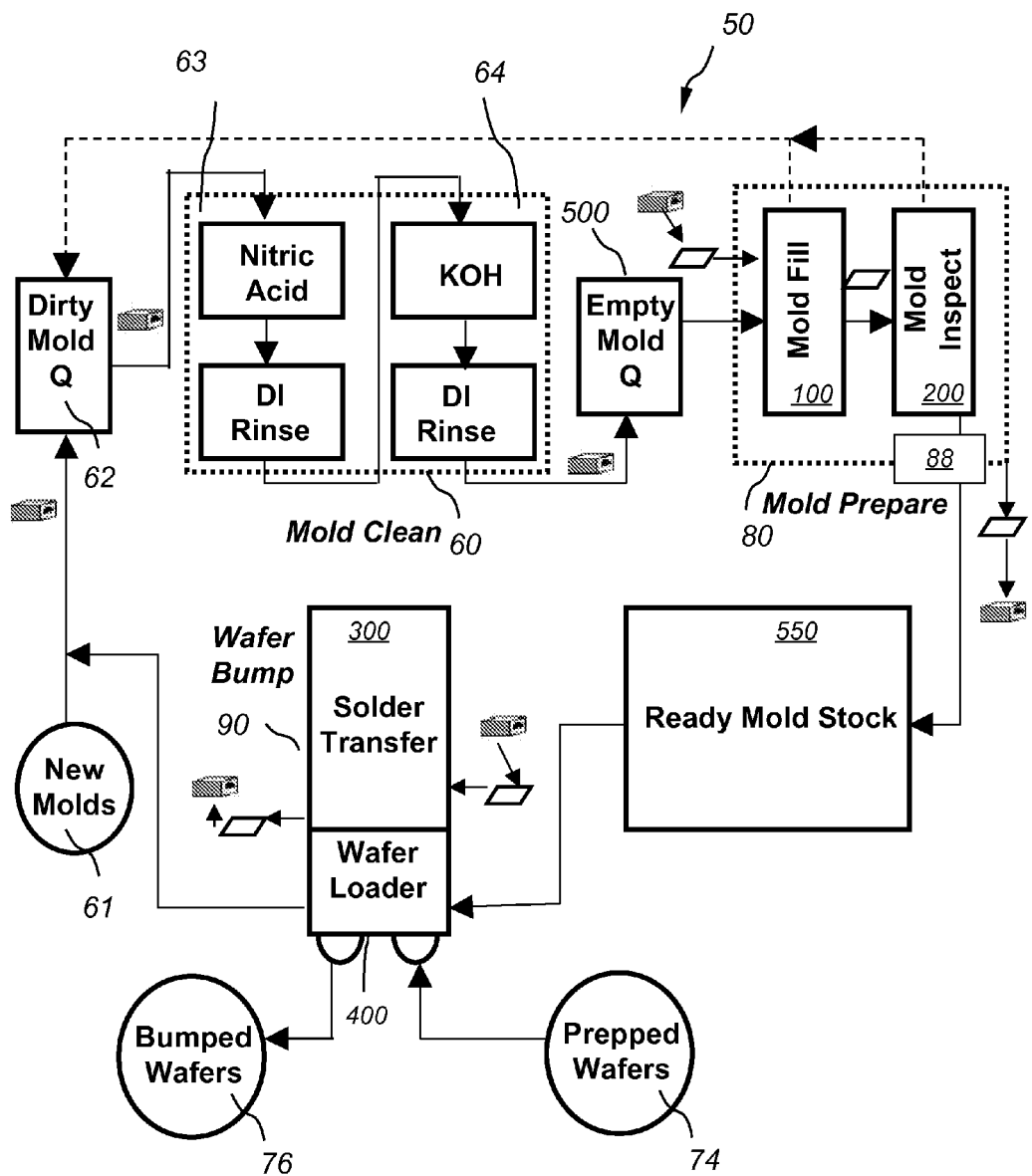
FIG. 3 is a block diagram of the scale-up IMS line process flow.
Figure 4:
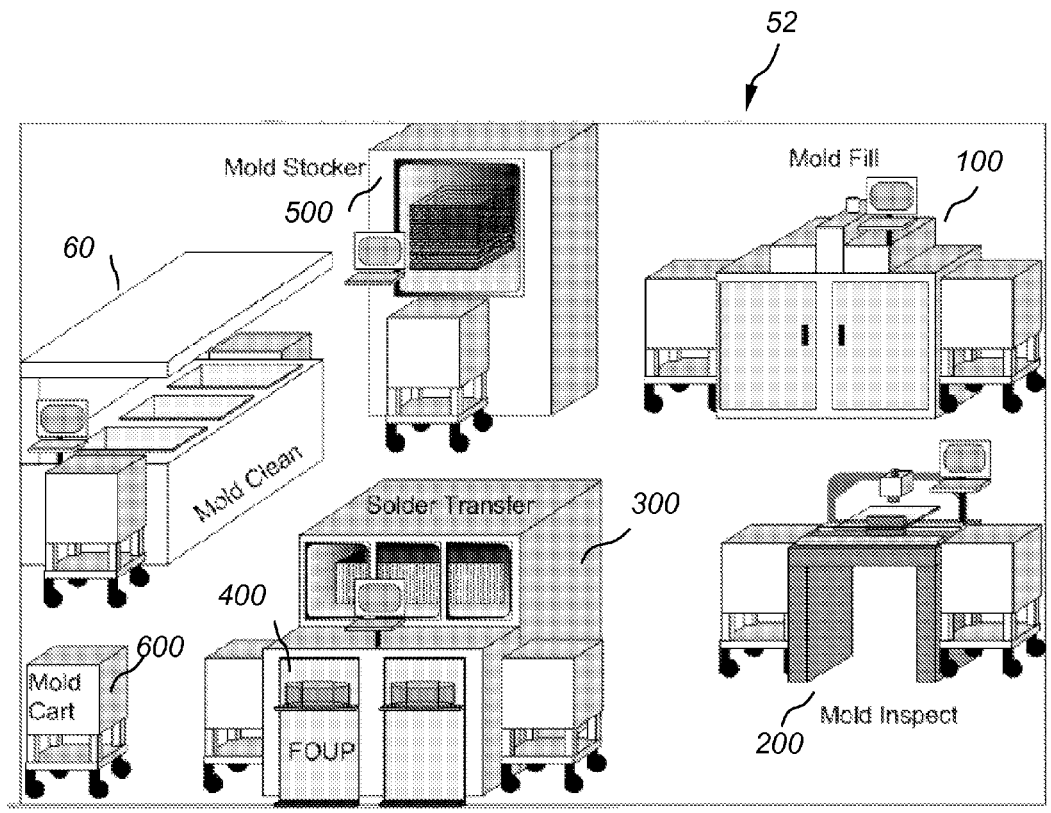
FIG. 4 is a schematic diagram of the HVM IMS line equipment system according to this invention.

Referring to FIG. 2, the scale-up IMS process 50 includes filling mold cavities with solder (34), inspecting the filled mold plate (86), forming a pattern on the semiconductor wafer surface (32), inspecting the wafer surface (75) and then transferring the solder from the mold cavities to the semiconductor wafer surface (38). Referring to FIG. 3, the scale-up IMS process 50 includes cleaning of the molds at a mold clean station 60, filling of the mold cavities with solder and inspecting the filled mold plate at a mold prepare station 80, and transferring of the solder from the mold cavities onto the patterned semiconductor wafer surface at a wafer bump station 90. The mold prepare station 80 includes a mold fill tool (MFT) 100, a mold inspect tool (MIT) 200, and a mold repair tool 88. The wafer bump station 90 includes a solder transfer tool (STT) 300 and a wafer loader tool 400. New molds 61 and previously used molds 62 pass through the mold clean station 60 where they get cleaned with an acid solution 63 and a base solution 64. The clean molds 82 enter a mold stocker 500 and from there they are introduced into the MFT 100. After filling the mold cavities with solder, the molds are inspected at the MIT 200 and then transferred to a ready mold stocker 550. Molds that do not pass inspection are either recycled at the mold clean station 60 or are repaired at the repair tool 88. Molds that are repaired pass through the MIT 200 again and upon passing the inspection are transferred to ready mold stocker 550. In some embodiments the mold repair tool 88 is integrated with the MIT 200. From the ready mold stocker 550 the molds are introduced into the STT 300. Patterned wafers 74 are introduced into the wafer loader 400 and from there into the STT 300. After the solder transfer process the bumped wafers 76 exit the wafer bump station 90 and the dirty molds 62b are introduced into the mold clean station 60 again. The process repeats until all wafers 74 are bumped. A schematic diagram of the HVM IMS equipment system 52 is shown in FIG. 4. It includes the mold clean station 60, the mold stocker 500, the MFT 100, the MIT 200, the STT 300, the wafer loader, i.e., front open unified pod (FOUP) 400 and a mold cart 600. In one example, the HVM system 52 has a capacity of 300 wafer per day (1 wafer every 4 minutes) and 350 molds per day (1 mold every 3.5 minutes). It provides automation of the wafer and mold transfer. The STT can process 200 mm and 300 mm wafers without any hardware changes and each mold carrier can carry up to 25 molds. The molds are identified with a bar code mechanism and the mold stocker/sorter is integrated in the process line. There is also an integrated mold and wafer tracking and management system. The system can accommodate any solder type including no lead/eutectic PbSn (low temperature) at start up and high lead later.

Figure 5:
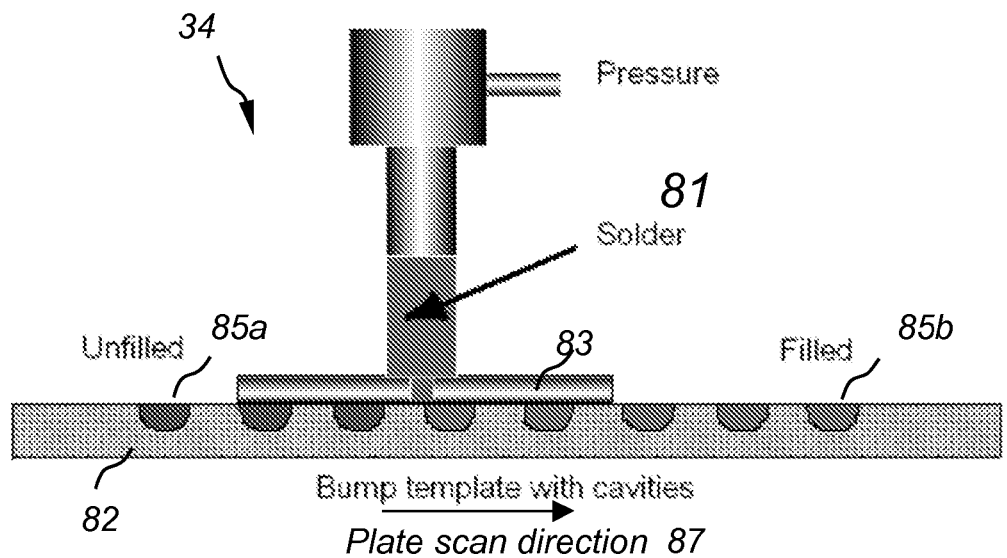
FIG. 5 is a schematic side view diagram of the mold fill process.
Figure 6:
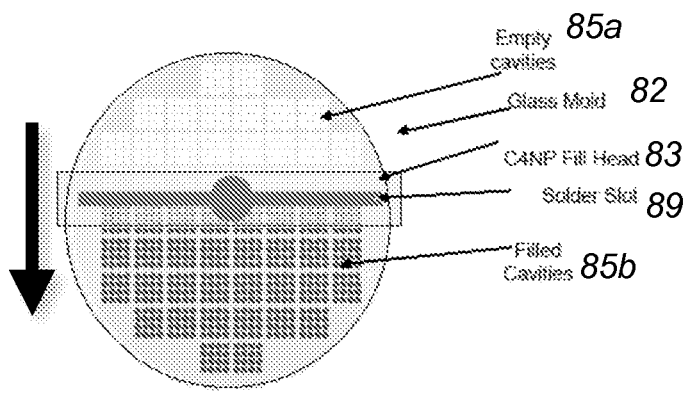
FIG. 6 is a top view diagram of the mold fill process.
Figure 7A:
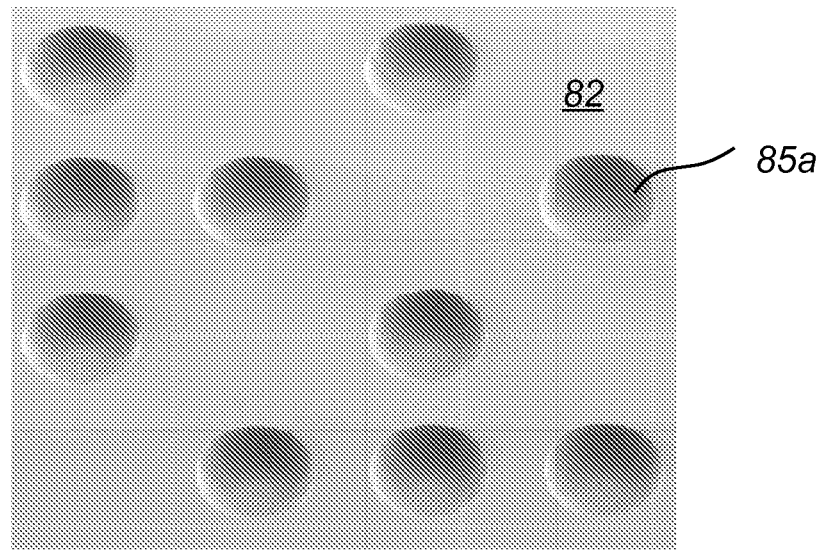
FIG. 7A is a magnified view of a mold area with unfilled cavities.
Figure 7B:
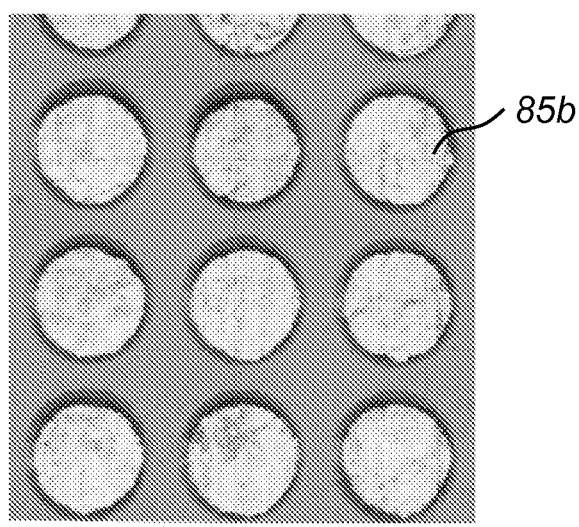
FIG. 7B is a magnified view of a mold area with solder filled cavities.

Referring to FIG. 5 and FIG. 6, the mold fill process 34 includes melting bulk solder (wire, shots, slugs) in a reservoir 81. Reservoir 81 is heated above the melting point of the solder and is slightly pressurized. An injector head 83 communicates with the reservoir 81 and is in contact with the mold plate 82. Mold plate 82 is scanned under the injector head 83 in the scan direction 87 and molten solder is injected through a solder slot 89 formed at the bottom of the injector head 83 and fills the empty cavities 85a in the mold 82. The filled mold plate is then cooled and inspected at the MIT 200. FIG. 7A depicts a glass mold plate 82 with unfilled cavities 85a and FIG. 7B depicts a glass mold with filled cavities 85b. Cavities 85 are etched on the glass mold 82 according to the required bump pattern. The glass mold 82 has a thermal expansion coefficient (CTE) similar to the CTE of the semiconductor wafer 72.

Figure 8:
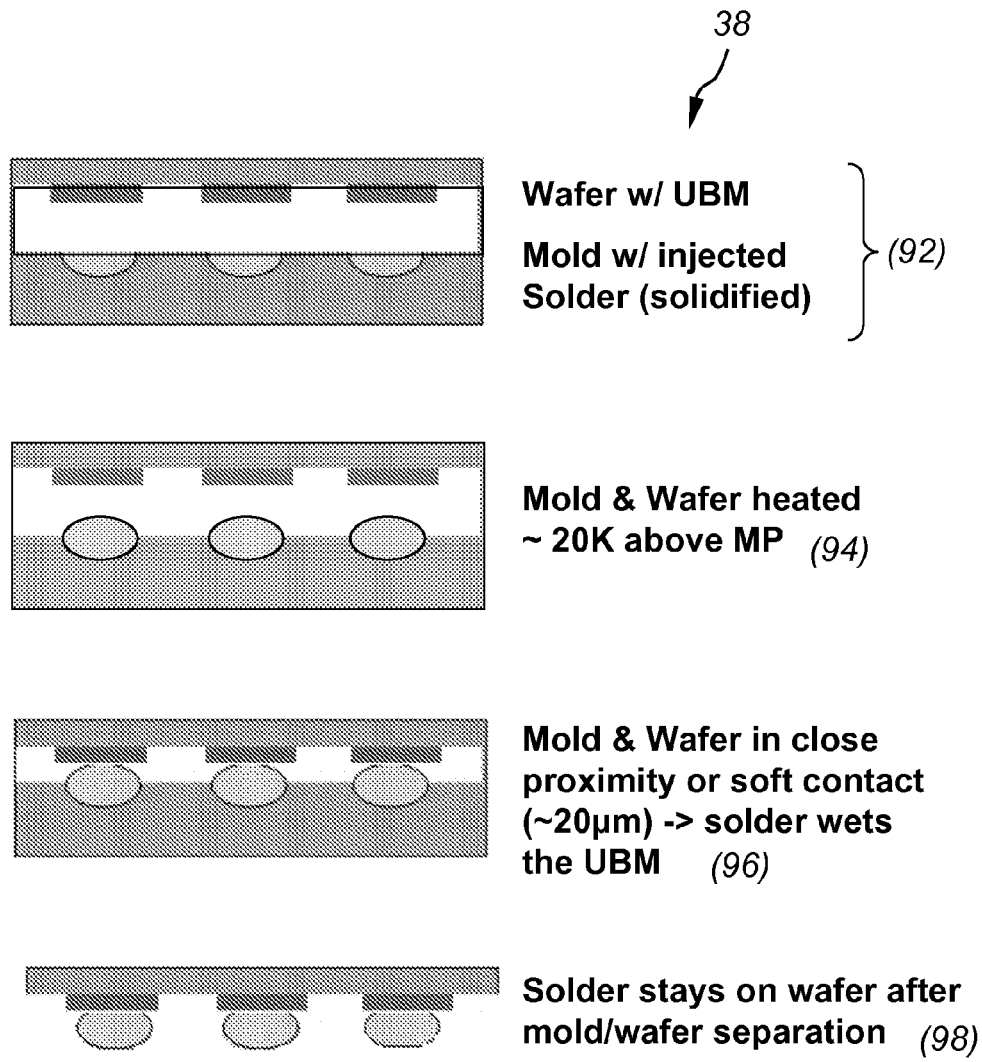
FIG. 8 is a schematic diagram of the solder transfer process.

Referring to FIG. 8, the solder transfer process 38 includes bringing together a wafer 74 patterned with under bump metallurgy (UBM) structures 73 with a mold plate 82 having solder filled cavities 85b (92). Next, heating the mold 82 and the wafer 74 to a temperature of 20 degrees higher than the solder melting point (94) and then bringing the mold 82 and wafer 74 in close proximity (about 20 micrometers) or soft contact so that the solder wets the UBM structures 73 (96). The solder bumps from the cavities 85b are transferred to the UBM structures 73 and stay on the wafer 74 after the mold 82 separates from the wafer 74 (98). A critical aspect of this process is the alignment of the mold plate 82 relative to the semiconductor wafer 74 so that the solder bumps 85b are transferred to precise UBM structures 73. The alignment needs to be maintained during the transport of the aligned mold-wafer system from station to station and during the actual solder transfer process at the required temperature, atmosphere and pressure.

Figure 9:
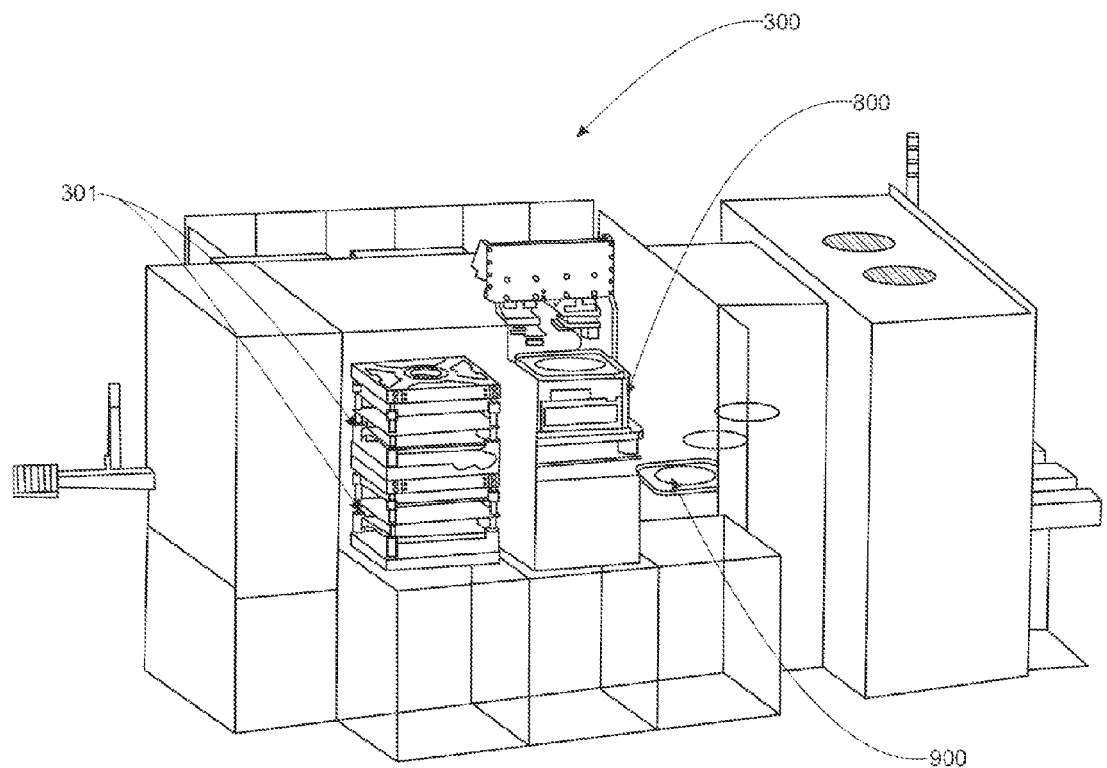
FIG. 9 depicts the HVM STT equipment system of this invention.
Figure 10:
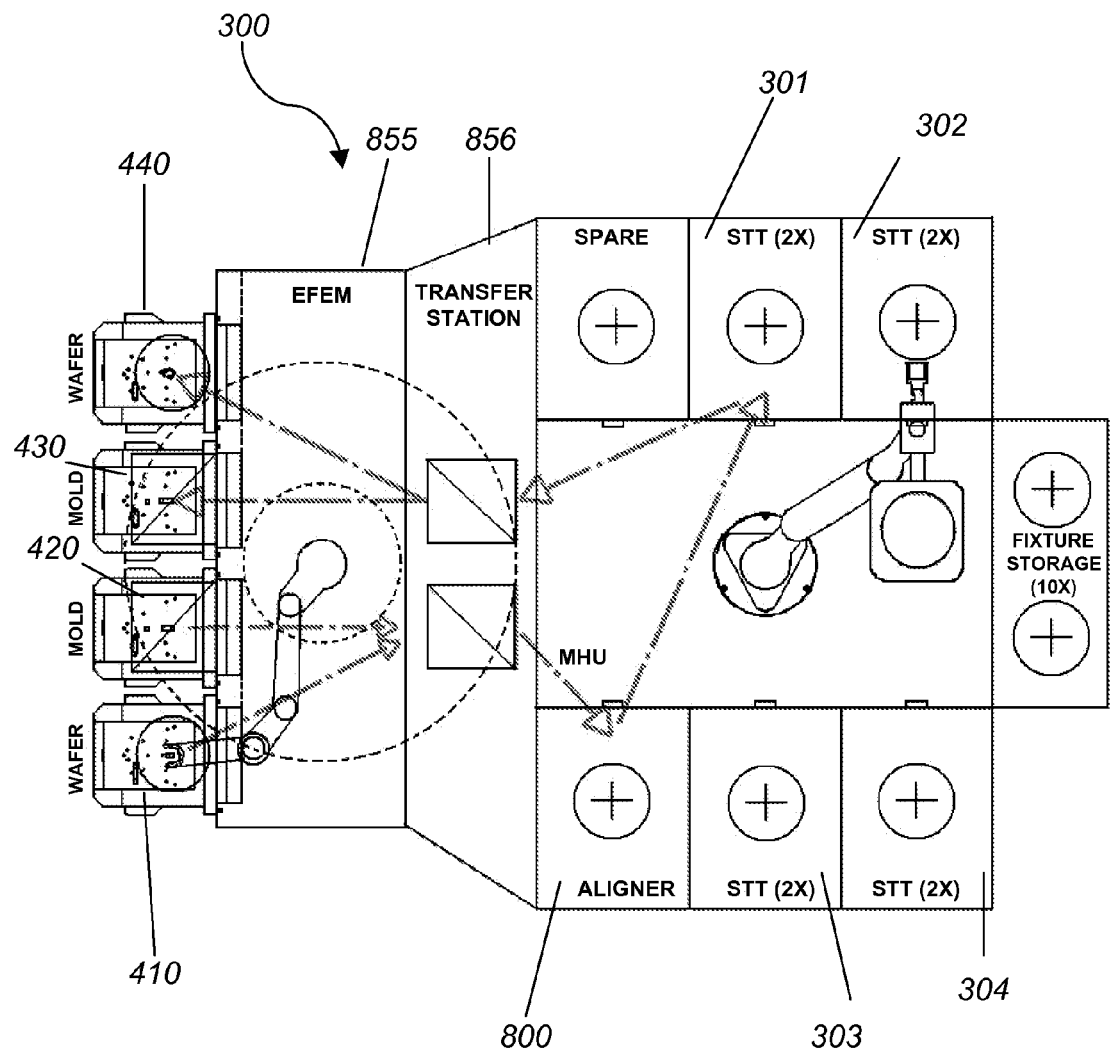
FIG. 10 depicts the HVM STT material flow.
Figure 11:
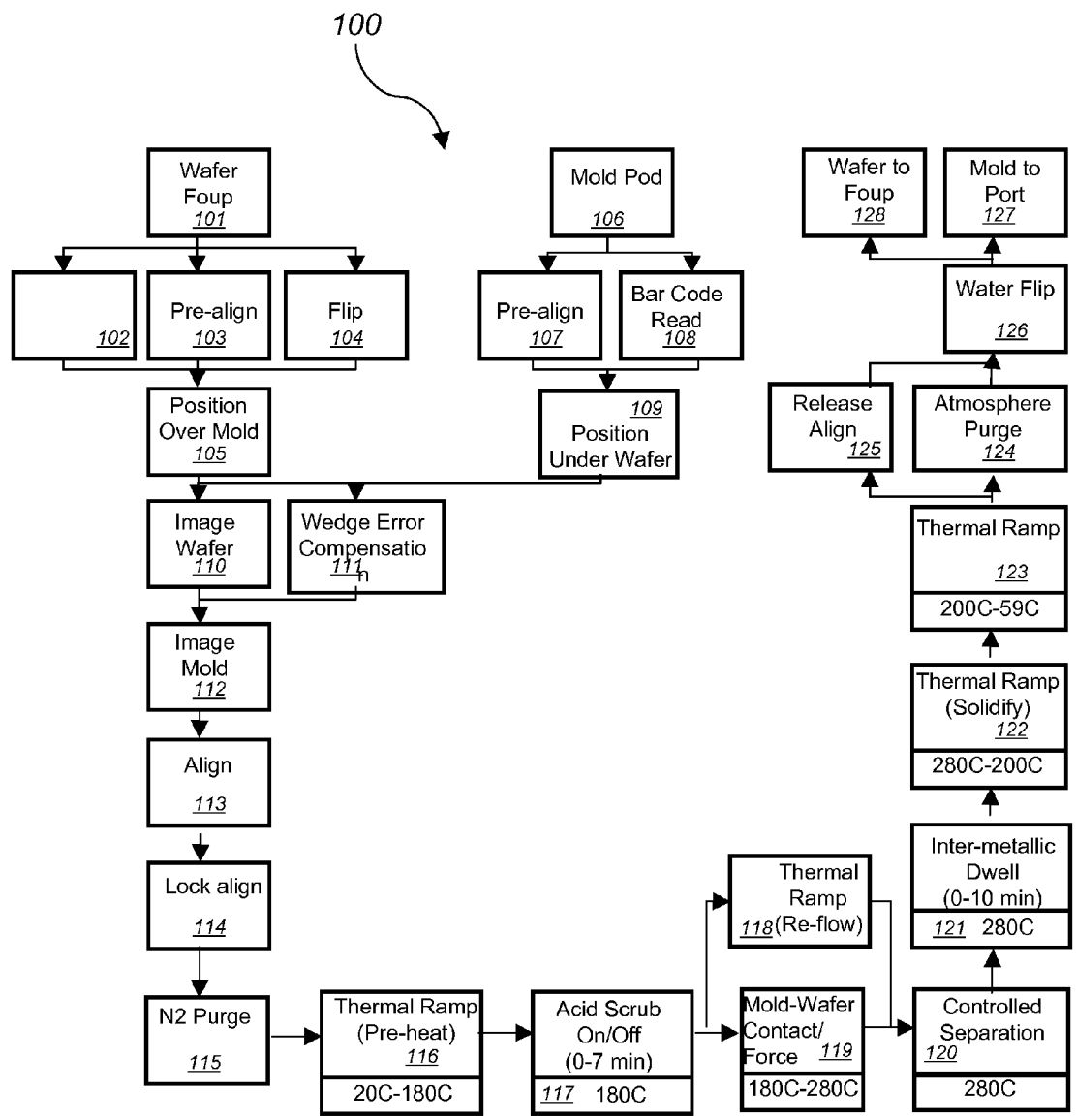
FIG. 11 is a schematic block diagram of the STT process steps.
Figure 12:
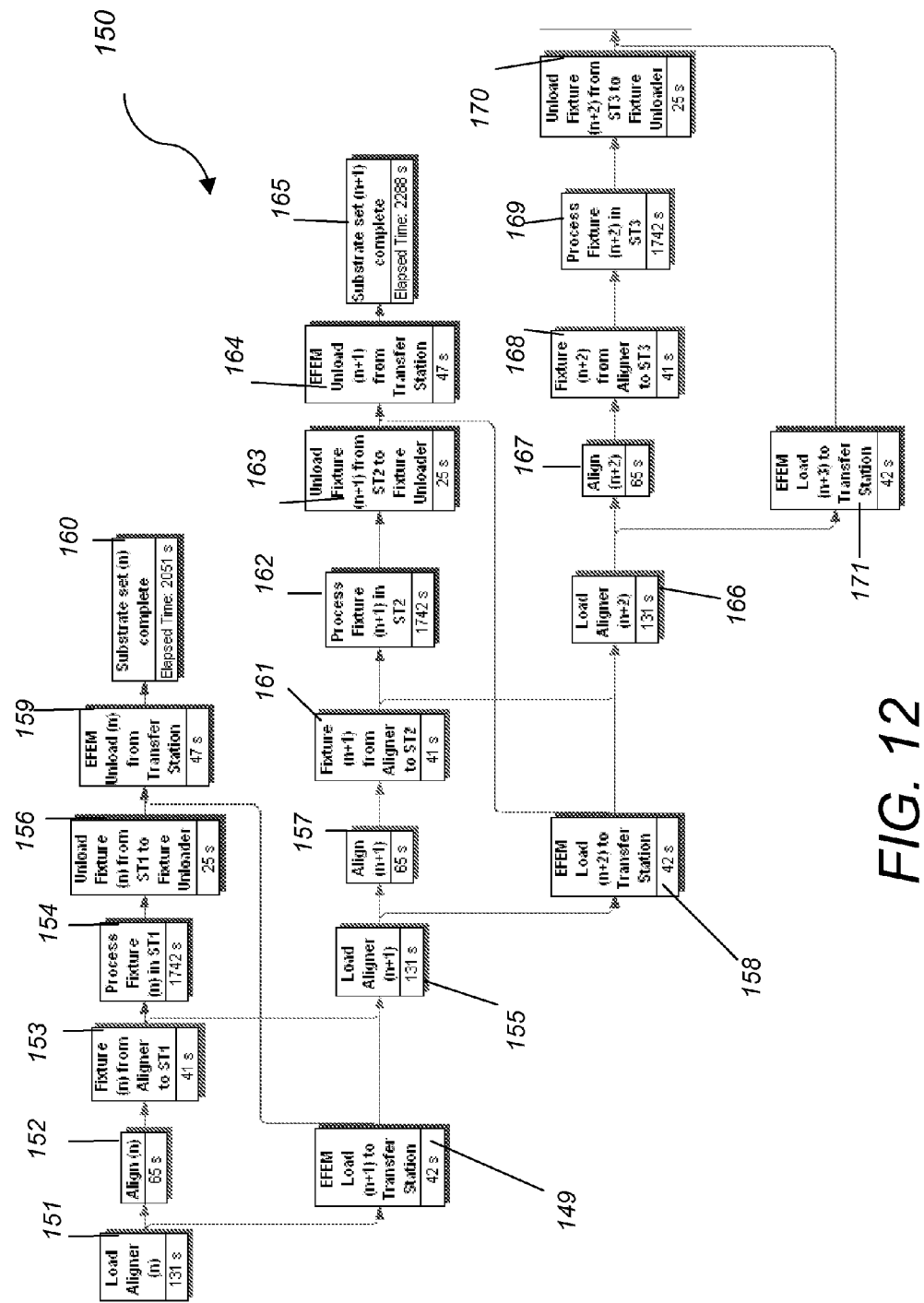
FIG. 12 is a schematic block diagram of the STT steady-state cycle time.

Referring to FIG. 9, the HVM STT equipment system 300 includes a mold/wafer aligner 800, a mold/wafer transport fixture 900 and the solder transfer tool (STT) chamber unit 301. Referring to FIG. 10, FIG. 11 and FIG. 12, the HVM STT process 100 includes the following steps. First the patterned wafer 74 enters the wafer FOUP unit 410 (101) and the filled mold 82 enters the mold pod unit 420 (106). Next, a robot end effector module (EFEM) 850 transfers the wafer 74 and the mold 82 in the transfer station 856 where the wafer 74 is optically characterized (102), pre-aligned (103) and flipped (104). The filled mold 82 is pre-aligned (107) and the mold identifying barcode is read and entered in the computer (108). Next, a robot end effector module (EFEM) 850 transfers the wafer 74 and the mold 82 in the aligner module 800. In the aligner the wafer and mold are placed in the mold/wafer transport fixture 900 so that the mold 82 is positioned under the wafer (105, 109) and images of the wafer and the mold are taken (110, 112). The Wedge Error Compensation process is performed at this point (111). Wedge Error Compensation describes the action of "floating" the mold on the aligner chuck so that it evenly contacts all the fixture spacer flags (which in turn sit on the wafer edge). Once in even contact, the mold chuck locks and the parallelism (no wedge error) of mold to wafer is set. Next, the mold and the wafer are aligned (113) and the aligned mold and wafer are locked in the transport fixture 900 (114). Transport fixture 900 with the aligned mold 82 and wafer 74 is then transferred in the STT chamber unit 301, where the transfer of the solder bumps takes place. The aligned mold and wafer are purged with nitrogen (115) and then are preheated (116). In one example, the temperature is increased from room temperature to 180 degrees C. in 2 minutes. At the temperature of at least 180 degrees C. the mold 82 and wafer 74 are scrubbed with an acid (117) and then the temperature is increased from 180 degrees to 280 degrees (118) in 3 minutes. Next, the mold is brought into contact (under controlled pressure) with the wafer (119) and the solder bumps 85b transfer from the mold cavities 85 onto the UBM pads 73 of the patterned wafer 74. After the solder transfer the mold is separated from the wafer in a controlled way (120). The separated wafer and mold are kept at the temperature of 280 degrees C. for about 10 minutes (121) so that a good inter-metallic bond is formed between the solder bumps and the conducting patterned lines on the wafer surface (inter-metallic dwell). Next, the temperature is ramped down to 200 degrees C. in 3 minutes and the solder bumps solidify on the wafer surface (122) and then the temperature is ramped down to 60 degrees in 8 minutes. The fixture 900 with the separated mold and wafer are purged with air (124) and the alignment lock is released (125). Next the wafer is flipped 126 and then the empty mold 82 is transferred to the mold port 430 (127) and the bumped wafer 74 to the wafer FOUP unit 440 (128). The process repeats itself for the next mold/wafer pair. In one example, the solder transfer process time is 29 minutes and the alignment time is 65 sec. The STT system is designed to have more than one STT chamber units 301 to increase the production throughput. In the example of FIG. 10, there are four STT chamber units 301, 302, 303 and 304. The STT system of FIG. 10 has a throughput of 150 wafer/day and an approximate production rate of one wafer every 8 minutes. This parallel process cycle is shown schematically in FIG. 12. As shown, a first mold/wafer pair positioned in a fixture (n) is loaded in the aligner (151), aligned (152) and then the aligned fixture is transferred from the aligner to the process station ST1 (153), where is processed (154). The processed fixture (n) is then unloaded from process station ST1 to the fixture unloader/transfer station (156) and from there the EFEM unloads fixture (n) to the corresponding mold port 430 or wafer unit 440 (159). The total processing time fixture (n) is 2051 seconds and is distributed as follows: 131 seconds for loading fixture (n) in the aligner (step 151), 65 seconds for aligning fixture (n) (step 152), 41 seconds for transferring the aligned fixture (n) to process station ST1 (step 153), 1742 seconds for the solder transfer process of fixture (n) (step 154), 25 seconds for unloading fixture (n) from ST1 to transfer station (step 156), 47 seconds for moving mold and wafer to their ports (step 159). In the next staggered parallel process a second mold/wafer pair in fixture (n+1) is loaded in the transfer station (149), then loaded in the aligner (155), aligned (157) and then the aligned fixture is transferred from the aligner to the process station ST2 (161), where is processed (162). The processed fixture (n+1) is then unloaded from process station ST2 to the fixture unloader/transfer station (163) and from there the EFEM unloads fixture (n+1) to the corresponding mold port 430 or wafer unit 440 (164). The total processing time for fixture (n+1) is 2288 seconds, is distributed as above and includes 42 second for waiting in the transfer station (step 149). Similarly, a third mold/wafer pair in fixture (n+2) (158) is processed in the next staggered process starting at step 158 and a fourth mold/wafer pair in fixture (n+3) is processed in the next staggered process starting at step (177).

Figure 15:
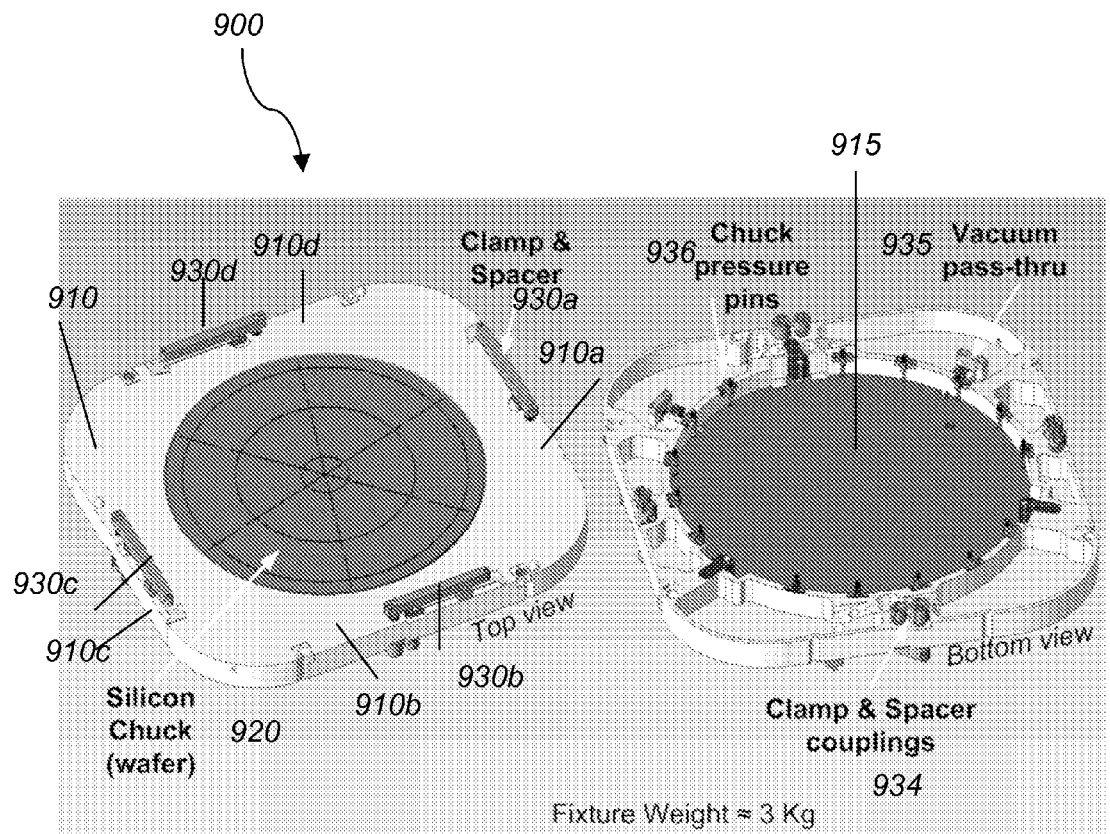
FIG. 15 depicts the STT mold/wafer transport fixture.
Figure 16:
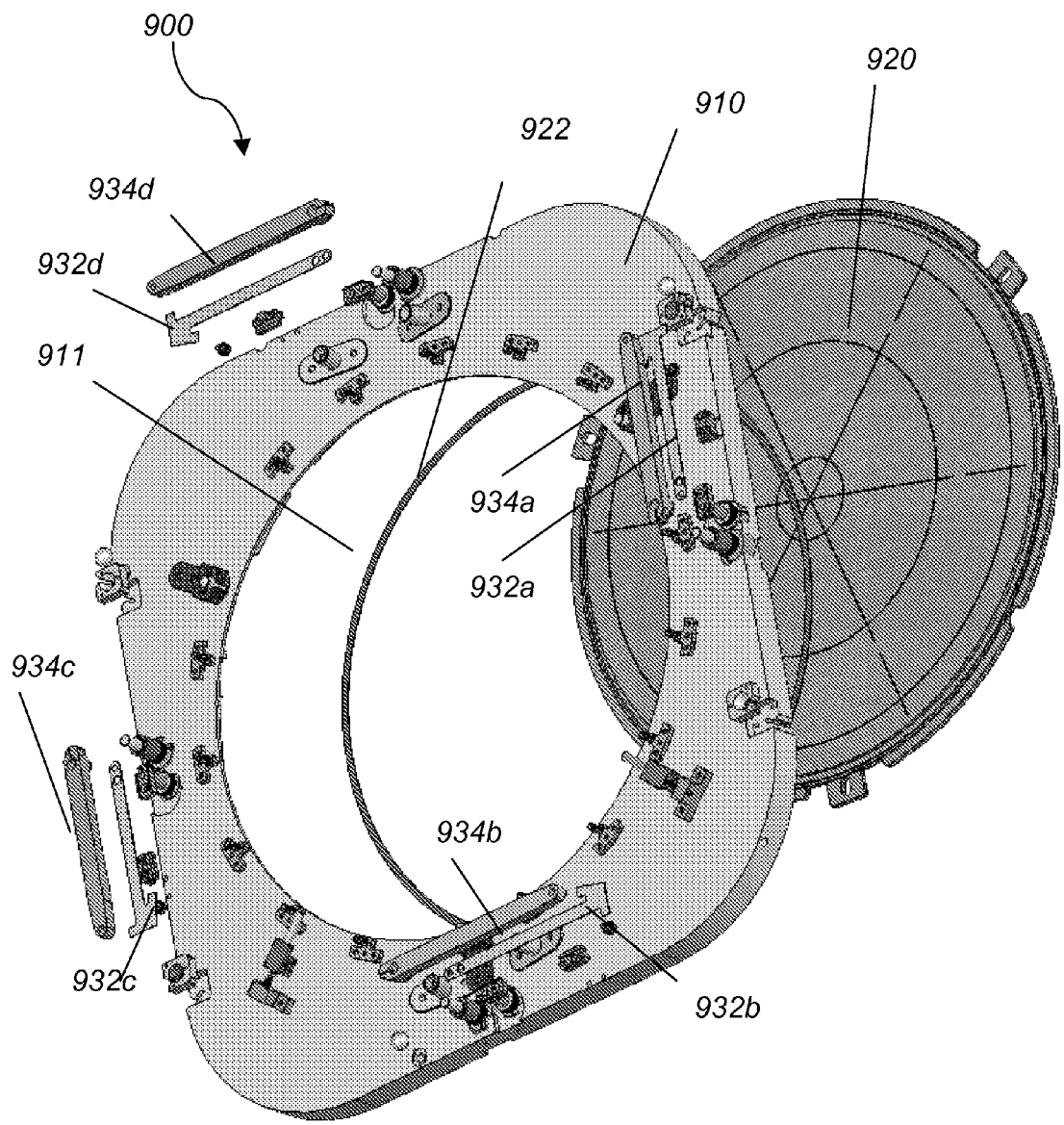
FIG. 16 is a front exploded view of the STT mold/wafer transport fixture.
Figure 17:
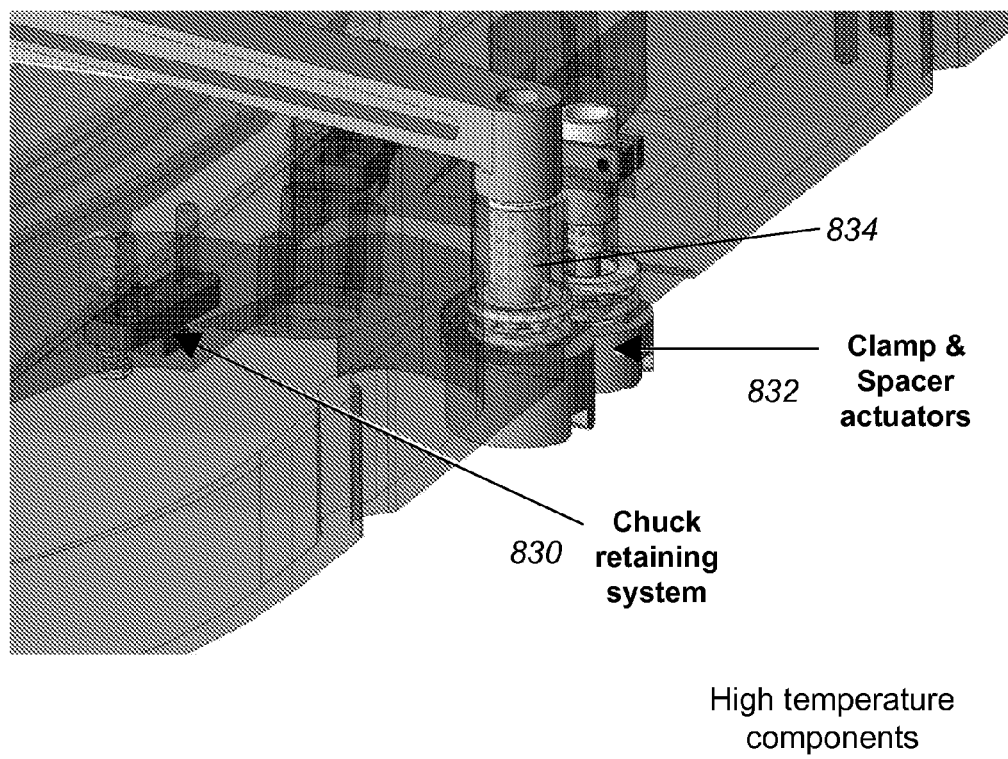
FIG. 17 illustrates the clamp and spacer actuators.
Figure 18A:
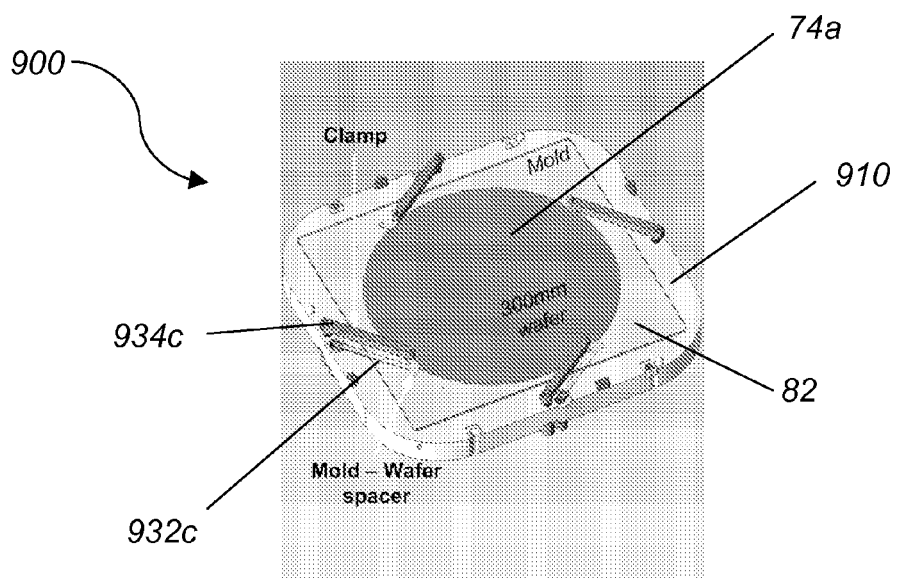
FIG. 18A illustrates the STT mold/wafer transport fixture with a 300 mm wafer.
Figure 18B:
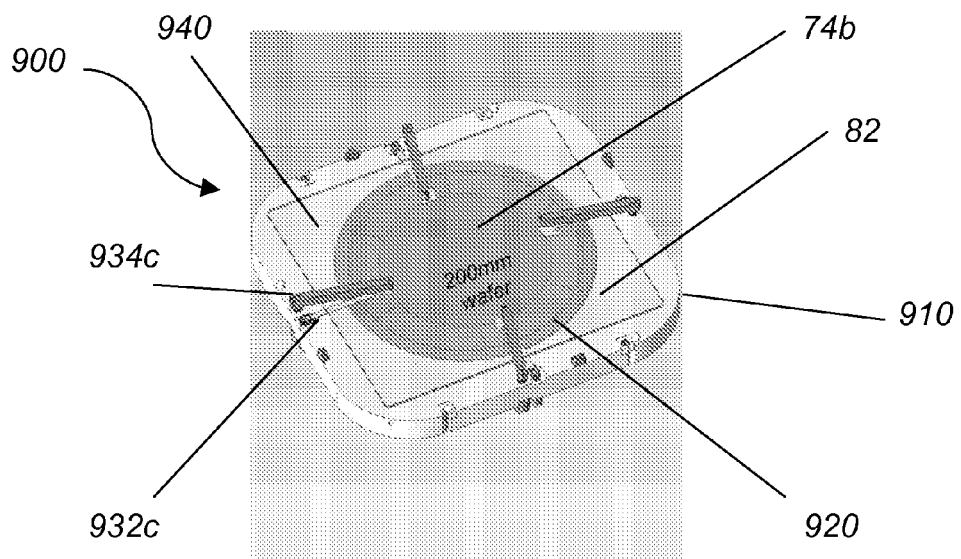
FIG. 18B illustrates the STT mold/wafer transport fixture with a 200 mm wafer.
Figure 30:
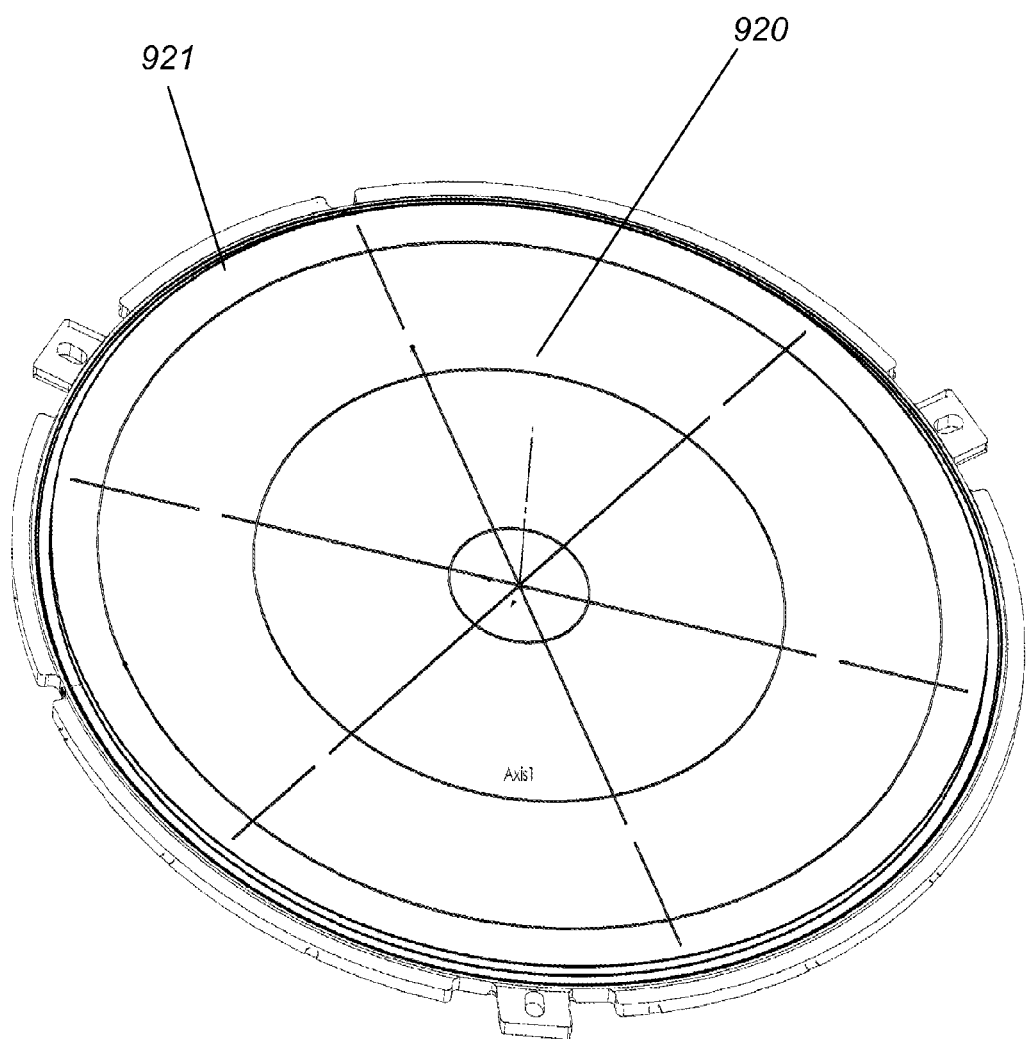
FIG. 30 is top view of the transport fixture wafer chuck.

Referring to FIG. 15 and FIG. 16, the mold/wafer transport fixture 900 includes a square frame 910 having a central aperture 911 and four clamp/spacer assemblies 930a-930d. A circular ceramic chuck 920 is mounted in the central aperture 911 of the frame and a seal ring 922 is placed at the interface between the front edge of the ceramic chuck and the backside edge of the central aperture 911. Clamp/spacer assemblies 930a-930d are mounted at the centers of each side of the square frame 910a-910d, respectively. Each clamp/space assembly 930a includes a spacer 932a and a clamp 934a. Spacer 932a and clamp 934a are independently remote controlled with actuators 832, shown in FIG. 17. The motion of spacer 932a and clamp 934a is very precise and repeatable both at room temperatures and at the high temperatures where the solder transfer process takes place. In the embodiment of FIG. 15, spacer 923a and clamp 934a are configured to rotate around an axis perpendicular to their elongated body and passing through an end or the center of their body. The high precision and repeatable rotation of the clamps and the spacer is accomplished by using high precision rotary stroke bearings 834 along the rotation shaft, shown in FIG. 17. In one example, rotary stroke bearings 834 are purchased from Mahr International Co, Goettingen, Germany. In other examples linkages, cam followers, or linear slides are used to provide repeatable high precision motion of the spacers and clamps. Spacers 932a-933d and clamps 934a, 934d are dimensioned and arranged so that the transport fixture 900 can accommodate both a 300 mm and a 200 mm wafer, as shown in FIG. 18A and FIG. 18B, respectively. In operation, a wafer 74 is loaded onto the silicon chuck 920 and spacers 932a-932d are placed on top of the wafer 74. Next, a mold 82 is placed on top of the spacers 932a-932d and then clamps 934a-934d are moved over the wafer/mold stack to clamp the stack together. The clamping force is applied through the spacers and this arrangement prevents the introduction of stresses or torque on the wafer or the mold, damage of the wafer and mold surfaces, contact between the mold and wafer and helps maintain the high accuracy alignment between the wafer and mold. The ceramic chuck 920 has circular and radial grooves 922 through which vacuum (vacuum grooves) is drawn to hold the wafer 74 in contact with the chuck 920. A vacuum pump line connects to the transport fixture 910 via the vacuum pass through elements 935. The ceramic chuck 920 has the same CTE as the wafer 74. In one example the chuck 920 is made of silicon and the seal ring 922 is made of graphite. In one example, the transport fixture frame 920 is made of aluminum or other thermally stable alloy and has a width of 420-430 millimeters, length of 430-440 millimeters, and a height of 40 millimeters. The central aperture 911 of the base 910 has a diameter of at least 300 millimeters to be able to accommodate substrates and wafers having diameter up to 300 millimeter. As shown in FIG. 30, the ceramic chuck 920 also has a raised edge 921 that contacts the graphite seal ring 922 to seal against the inner edge of the back surface of the transport fixture frame 910.

Figure 19:
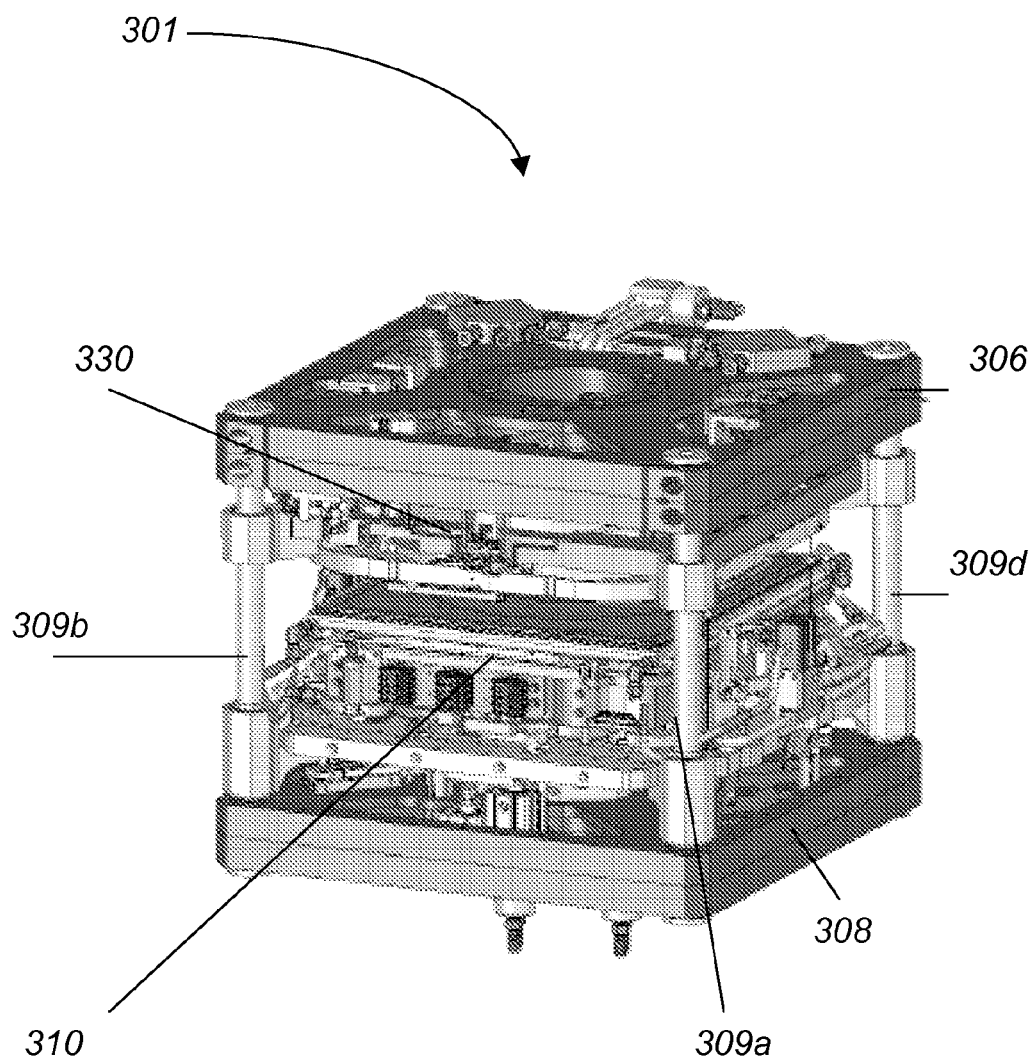
FIG. 19 depicts the HVM STT chamber.
Figure 20:
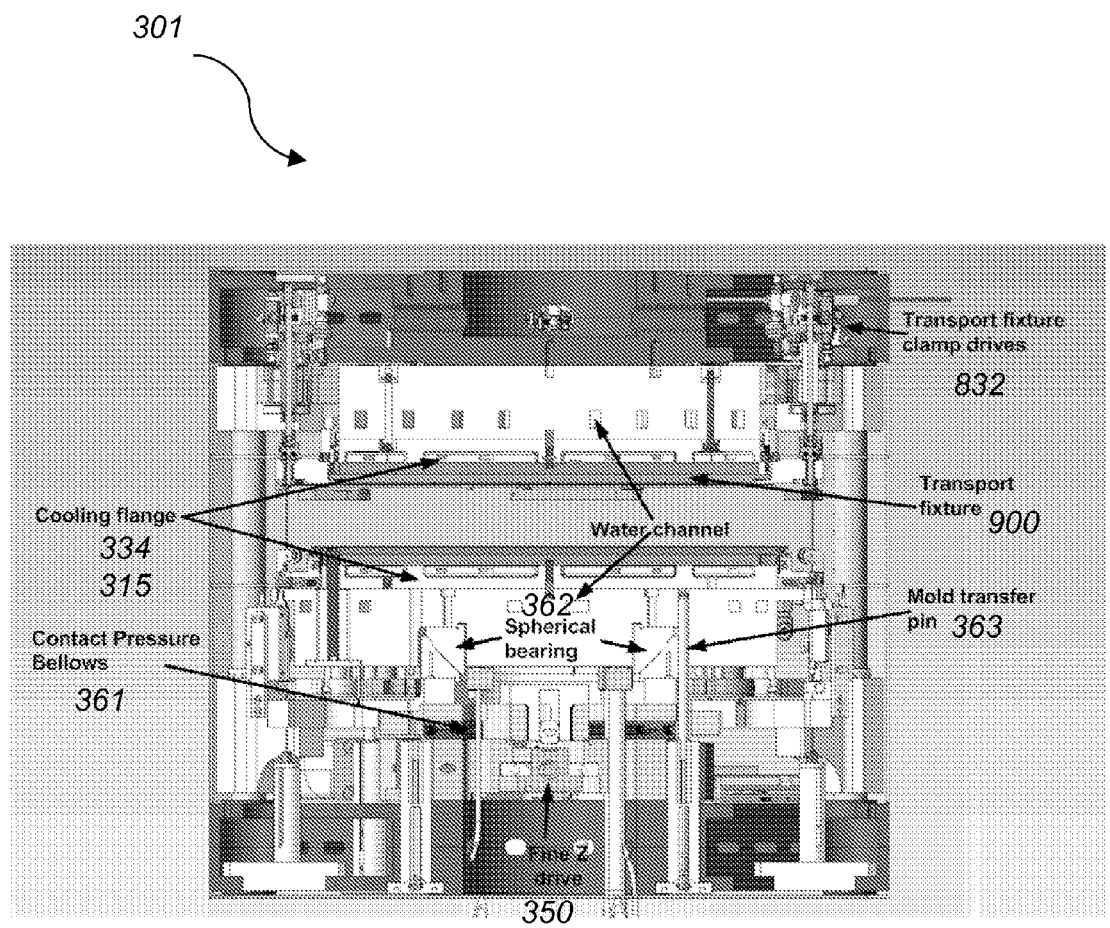
FIG. 20 is a cross-sectional view of the HVM STT chamber.
Figure 21:
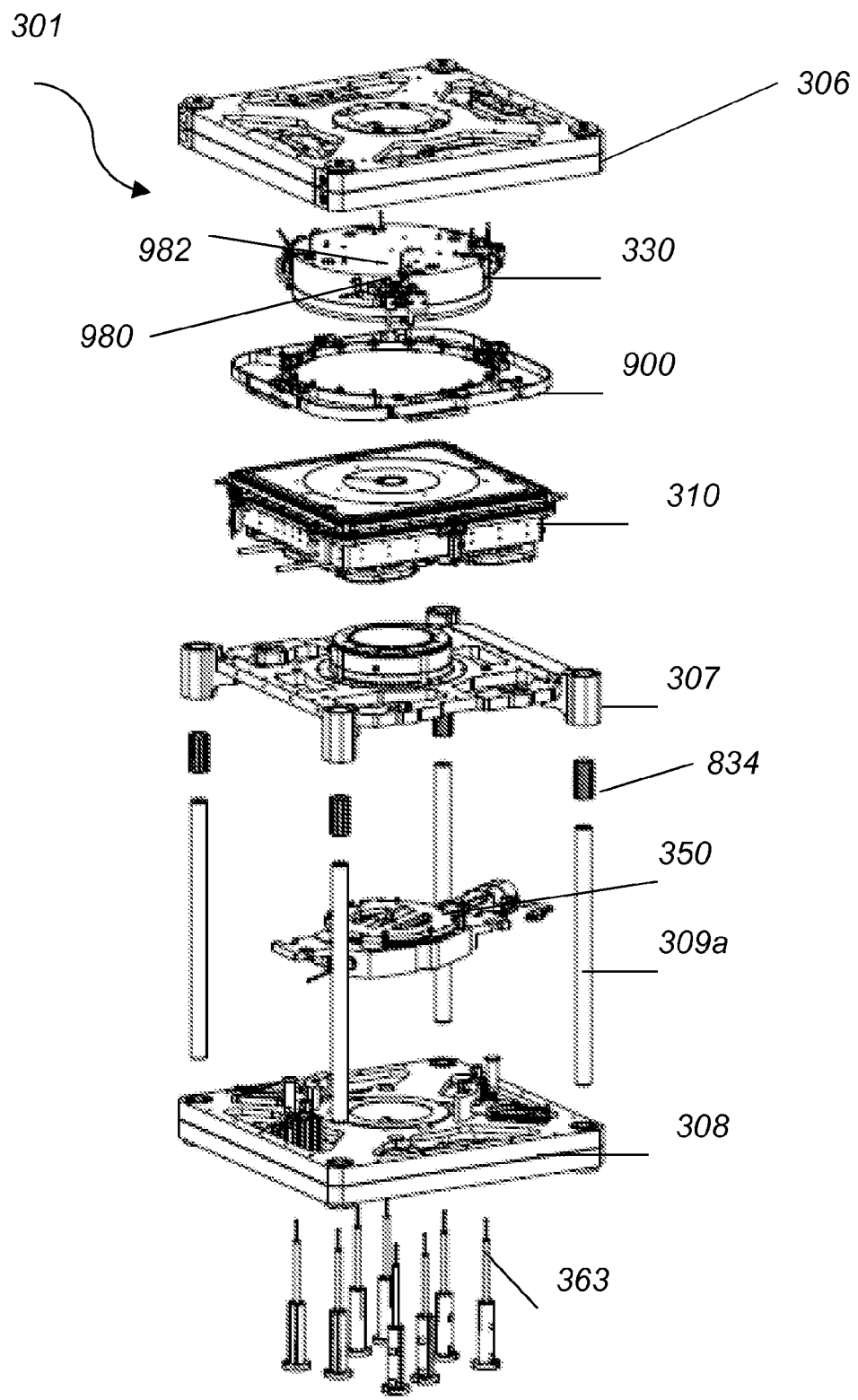
FIG. 21 is an exploded view of the HVM STT chamber.

Referring to FIG. 19, FIG. 20 and FIG. 21, STT chamber unit 301 includes a top frame 306, a bottom frame 308, frame Z-guide rods 309a-309d, a mold heater stack 310 supported on the intermediary frame 307, and a wafer heater stack 330 supported on the top frame 306.

Figure 22:
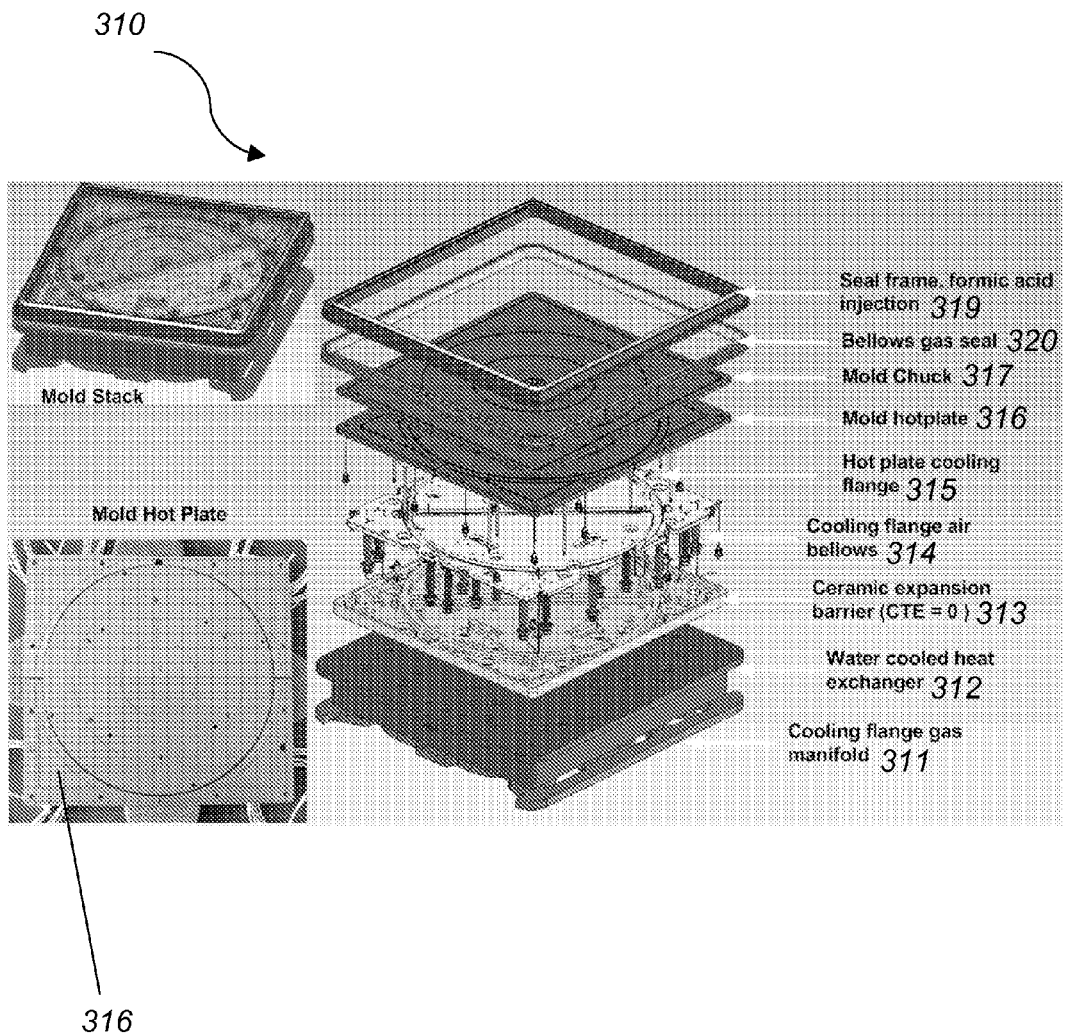
FIG. 22 is an exploded perspective view of the STT chamber mold stack.
Figure 23:
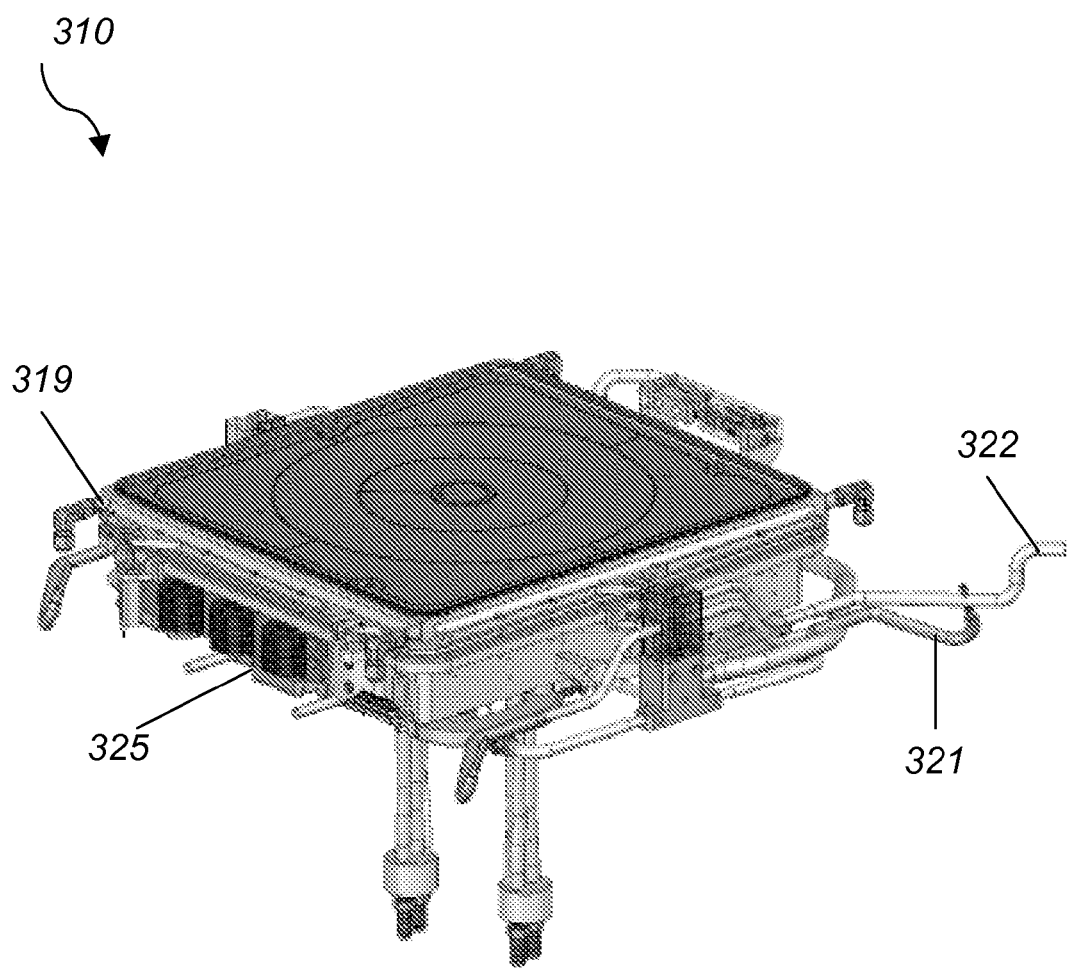
FIG. 23 is a perspective view of the mold heater stack.
Figure 24:
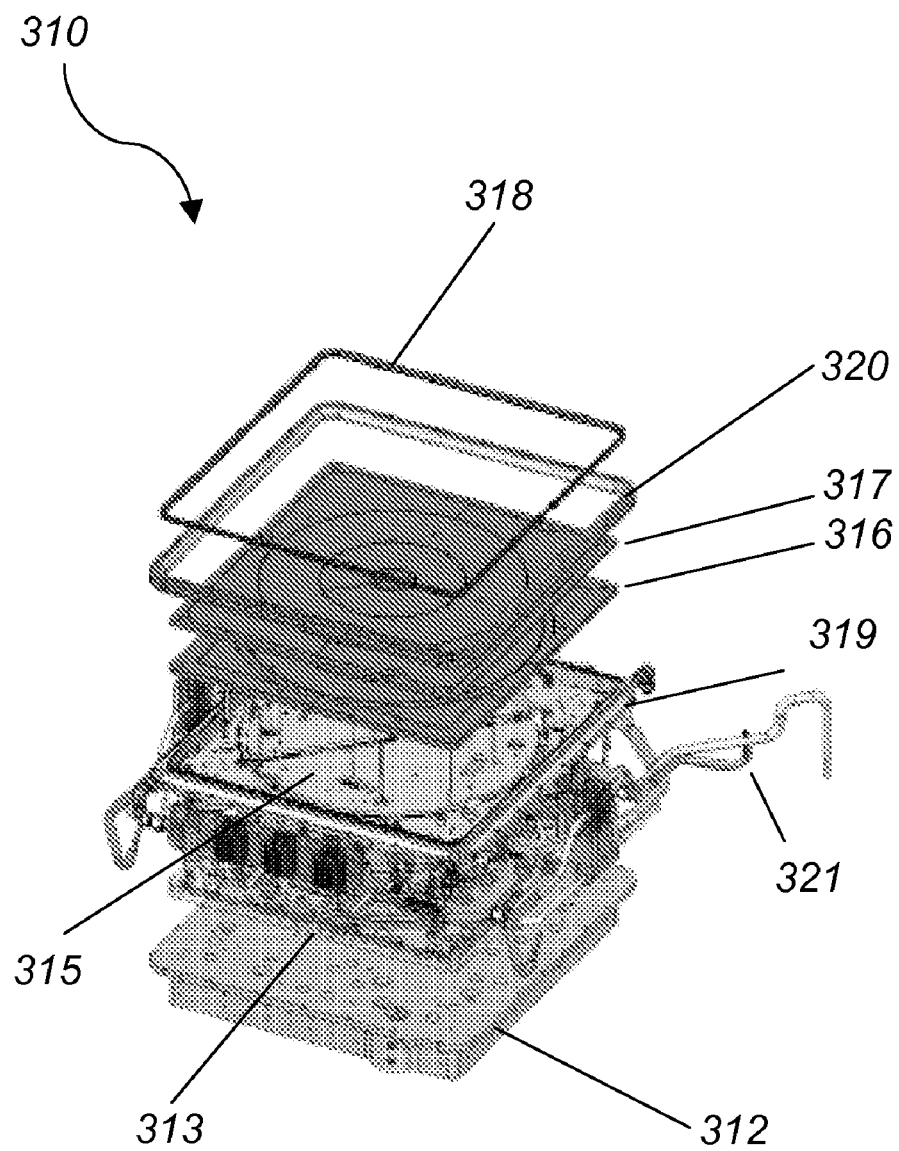
FIG. 24 is an exploded perspective view of the mold heater stack of FIG. 23.
Figure 25:
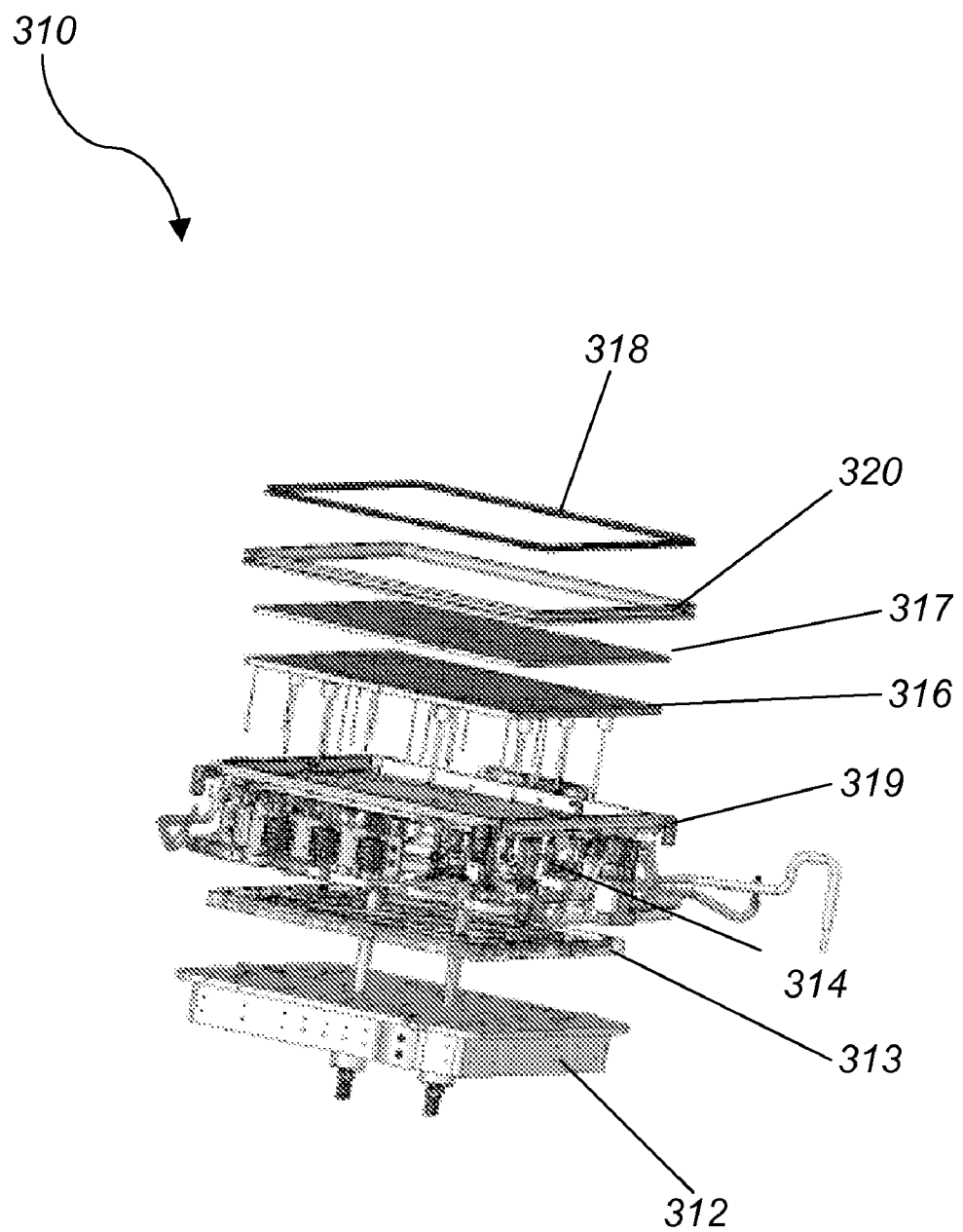
FIG. 25 is an exploded side view of the mold heater stack of FIG. 23.

Referring to FIG. 22 mold heater stack 310 includes a cooling flange gas manifold 311, a water cooled heat exchanger 312, a ceramic expansion barrier 313, cooling flange air bellows 314, a hot plate cooling flange 315, mold hot plate 316, mold chuck 317, bellows gas seal 320 and a seal frame 319 for the formic acid injection. The cooling flange gas manifold 311 is positioned below the water cooled heat exchanger 312. The heat exchanger 312 is made of a good thermal conducting material and is positioned below the ceramic expansion barrier 313. In one example, the heat exchanger 312 is made of aluminum. The ceramic expansion barrier 313 is made of a material with a low CTE and is positioned below the hot plate cooling flange 315. In one example barrier 313 is made of Zerodur®, a glass ceramic composite with a very low CTE, manufacture by Schott AG, Duryea, Pa., USA. The low CTE ceramic expansion barrier is capable of accommodating the high temperatures (about 300° C. or more) of the hot plate on one side while the other side is in contact with the water cooled heat exchanger which is at room temperature. Cooling flange air bellows 314 pass through through-bores formed in the water cooled heat exchanger 312 and the ceramic expansion barrier 313 to reach the cooling flange 315. The mold hot plate 316 is placed on top of the cooling flange 315 and the mold chuck 317 is placed on top of the hot plate 316. In one example mold chuck 317 is made of silicon carbide and hot plate 316 is a ceramic heater plate.

Figure 28:
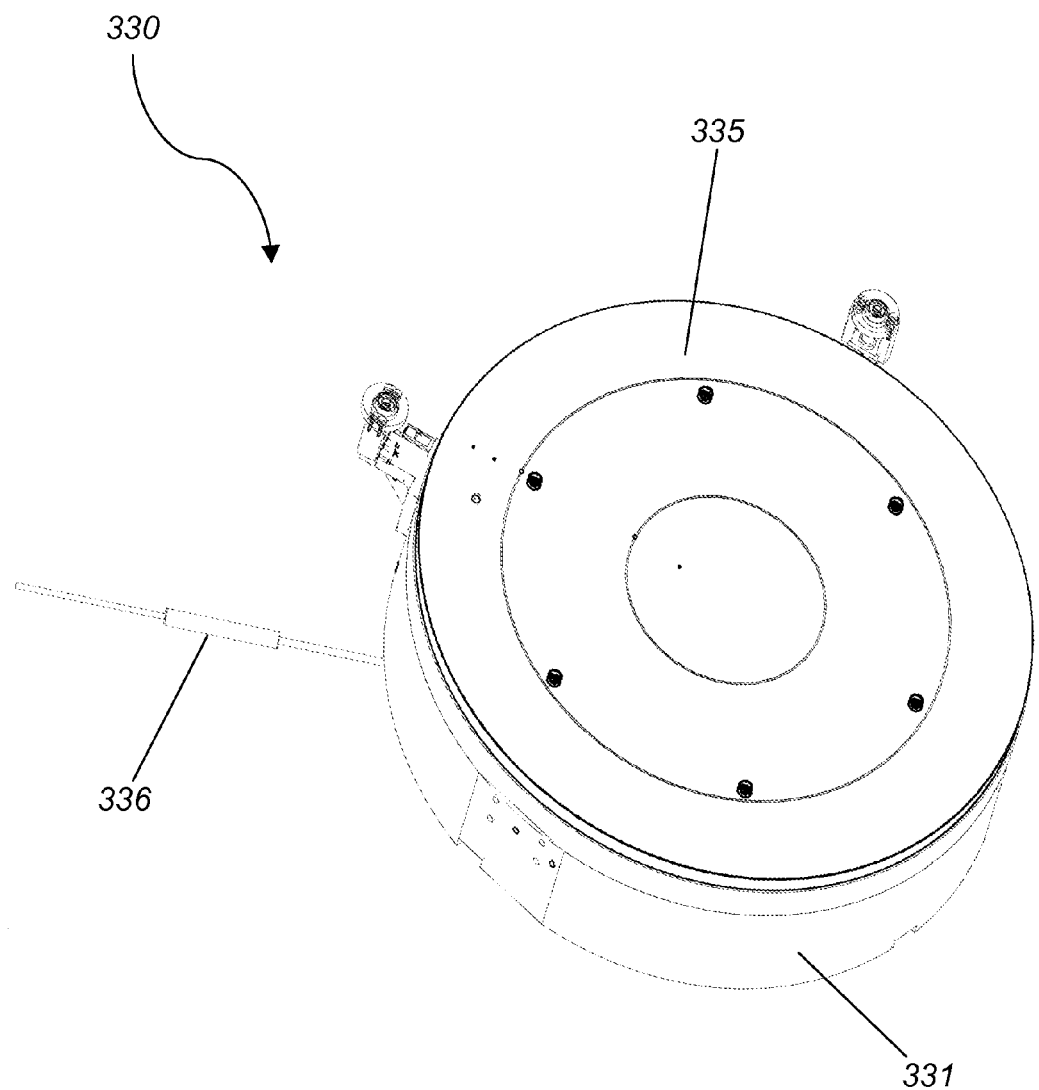
FIG. 28 is a top perspective view of the wafer heater stack.
Figure 29:
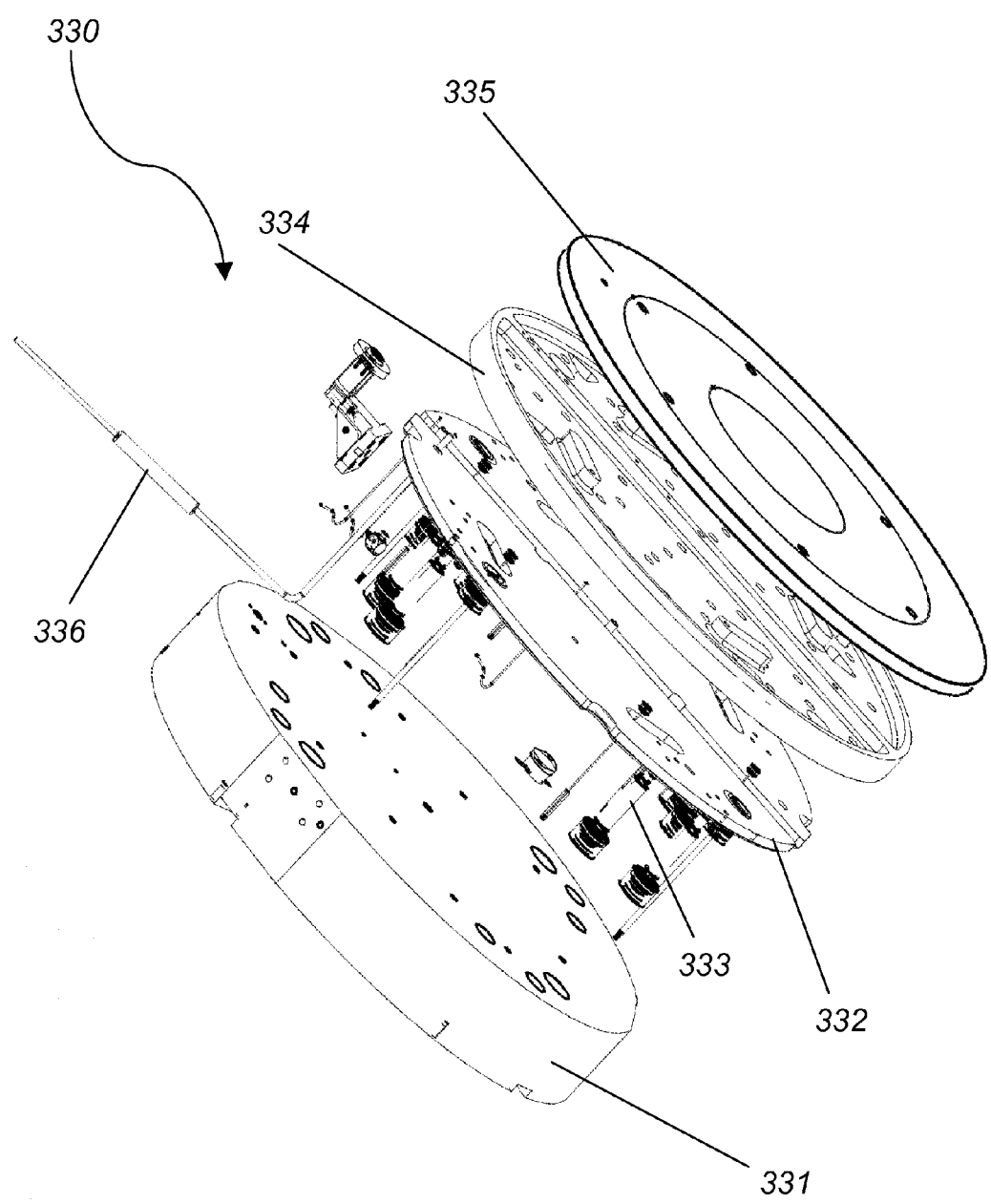
FIG. 29 is a side exploded view of the wafer heater stack of FIG. 28.

Referring to FIG. 28 and FIG. 29, the wafer heater stack 330 includes a water cooled heat exchanger 331, a ceramic expansion barrier 332, cooling flange air bellows 333, a hot plate cooling flange 334, and wafer hot plate 335. As was described above, the ceramic expansion barrier is made of a low CTE material capable of accommodating the high temperatures (about 300° C. or more) of the hot plate on one side while the other side is in contact with the water cooled heat exchanger which is at room temperature. The wafer heater stack 330 is arranged mirror imaged to the mold heater stack 310. The wafer chuck corresponding to the mold chuck 317 is provided by the wafer chuck 920 of the transport fixture 900, shown in FIG. 30. As shown in FIG. 30, the wafer chuck 920 has a raised edge 921 that contacts a graphite seal ring 922 to seal against the inner edge of the back surface of the transport fixture frame 910, shown in FIG. 32A.

Figure 32A:
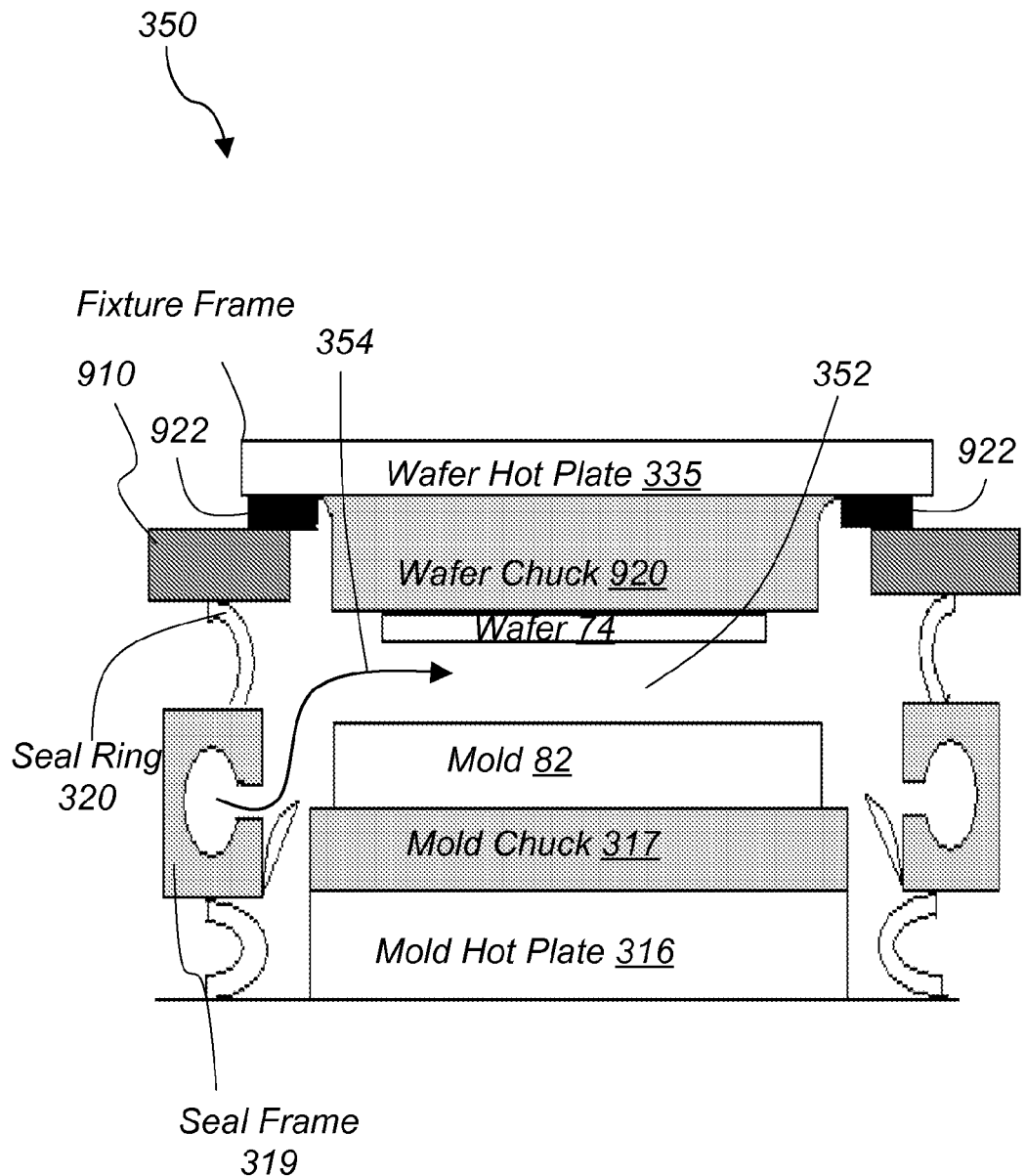
FIG. 32A is a schematic cross-sectional side view of the STT chamber with the installed transport fixture.
Figure 32B:
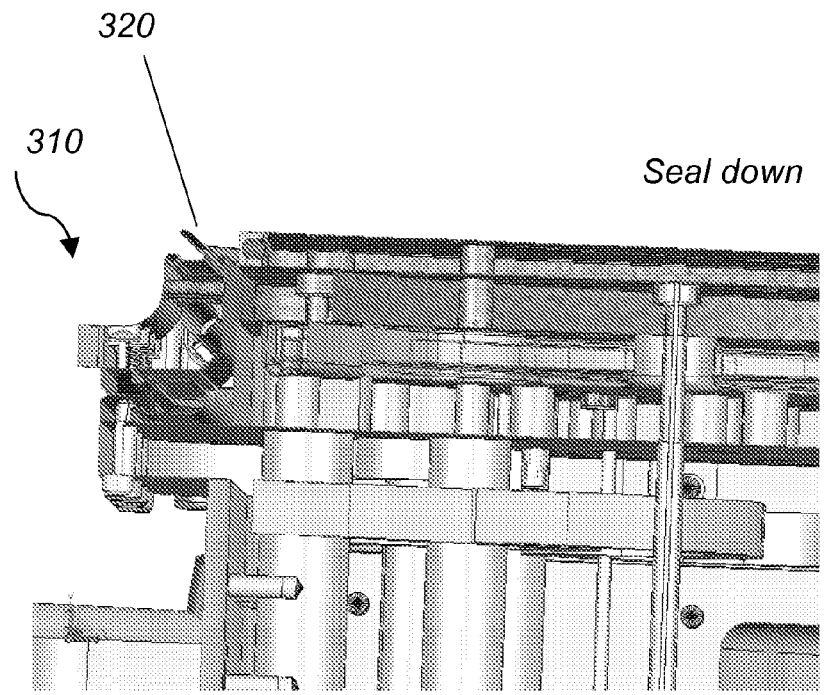
FIG. 32B depicts a cross-sectional side view of the mold stack with the seal down.
Figure 32C:
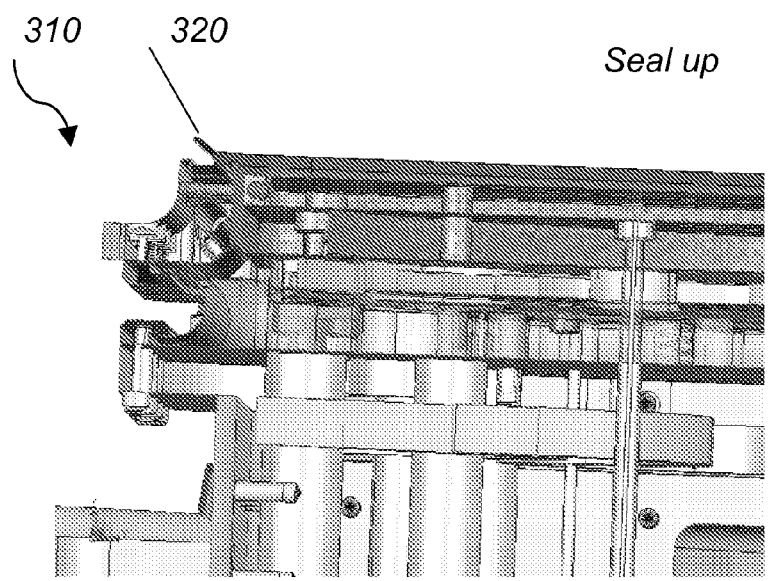
FIG. 32C depicts a cross-sectional side view of the mold stack with the seal up.

For the solder transfer operation, the transport fixture 900 with the aligned filled mold 82 and wafer 74 is placed in the solder transfer unit 301 between the mold heater stack 310 and the wafer heater stack 330. The transport fixture 900 is oriented between the mold stack 310 and the wafer stack 330 so that the back side of the wafer chuck 915 (shown in FIG. 15) is positioned to be in contact with the wafer hot plate 335 of the wafer stack 340 and the back side of the mold plate 940 (shown in FIG. 18B) is positioned to be in contact with the mold chuck of the mold heater stack 310. A temporary deposition chamber 350 is formed by bringing together the mold heater stack 310, the transport fixture 900 and the wafer heater stack 330, as shown in FIG. 32A. The bottom of the temporary deposition chamber 350 is formed by the mold hot plate 316, the mold chuck 317 and mold 82. Mold 82 is positioned so that its back surface 940 is in contact with the mold chuck 317 and the front surface with the filed cavities faces up. The top of the temporary deposition chamber 350 is formed by the wafer hot plate, wafer chuck 920 and wafer 74. Wafer 74 is positioned so that the patterned surface faces down directly opposite to the solder filled mold cavities. The top and bottom of the temporary chamber 350 are sealed together with the mold heater stack seal frame 319 and seal ring 320 and with the graphite seal 922 between the front raised edge of the wafer chuck 920 and the back side of the transport fixture frame 910. As shown in FIG. 32A, FIG. 32B and FIG. 32C, seal ring 320 is mounted on the seal frame 319 and is brought into contact with the front surface of the transport fixture frame 910 to seal the sides of the temporary chamber 350. During the solder transfer process the wafer 74 and mold 82 are unclamped from the fixture 900 and the wafer 74 is held in contact with the wafer chuck 920, which in turn is held by the wafer hot plate 335 and the mold 82 is held by the mold chuck 317 which in turn is held by the mold hot plate. An adjustable gap 352 is formed between the wafer 74 and the mold 82. Gap 352 is adjustable in the range between 0 and 3000 micrometers. Gap 352 is sealed on the sides with the seal ring 320 and graphite seal 922 and a process gas 354 is injected through the openings of the seal frame into the gap area 352. In one example, the process gas is formic acid. The process steps of FIG. 8 take place in this temporary deposition chamber 350.

Figure 26:
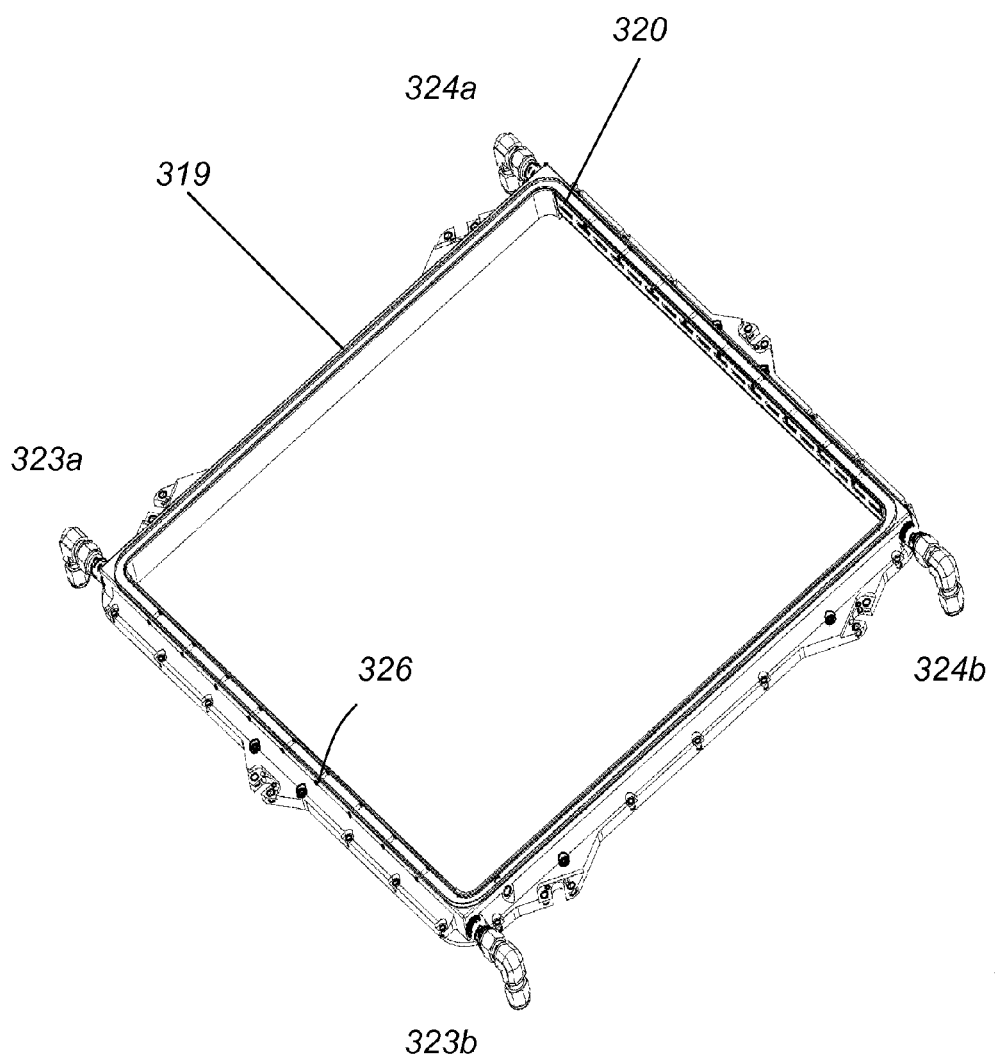
FIG. 26 is a top perspective view of the mold heater stack seal frame.
Figure 27:
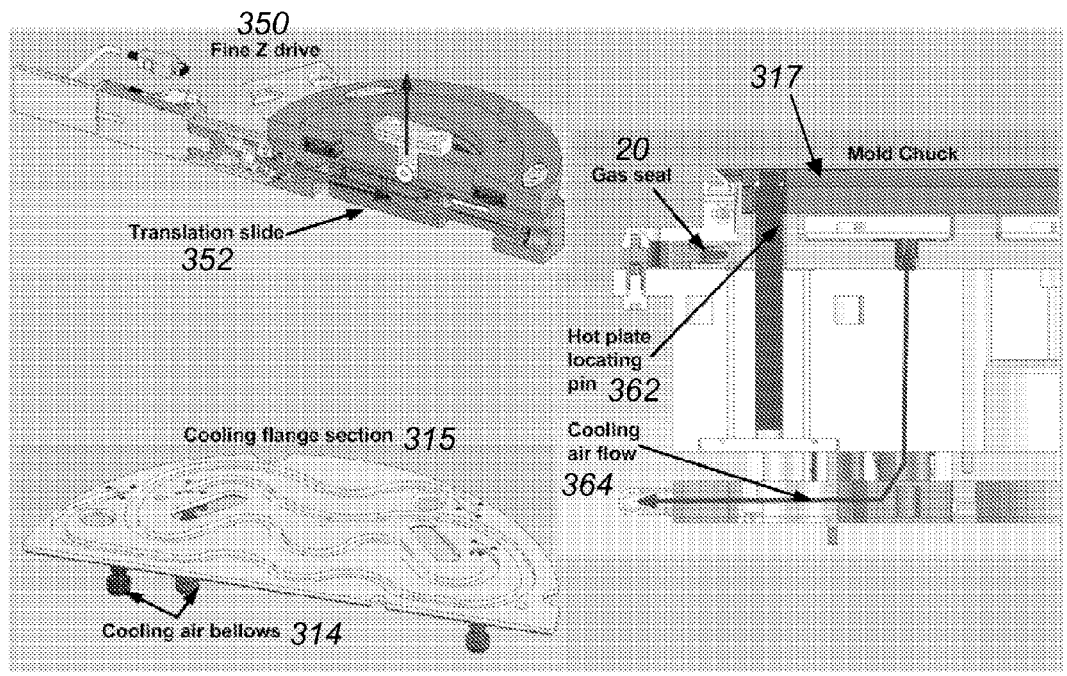
FIG. 27 is a side view of the hot plate cooling flange and the mold chuck fine Z-drive.

Referring to FIG. 26 seal frame 319 includes gas feedthrough connectors 323a, 323b and vacuum connectors 324a, 324b connecting to formic gas lines 321 and vacuum lines 322. Gas flow is controlled with Reed valves 325. Seal frame 319 includes a grove 326 where the bellows gas seal (seal ring) 320 is placed. Gas seal 320 is designed to withstand the harsh chemical and thermal environment of the deposition chamber 350. In one example gas seal 320 is made of Perlast® manufactured by Perlast Ltd, San Jose, Calif.

Figure 31:
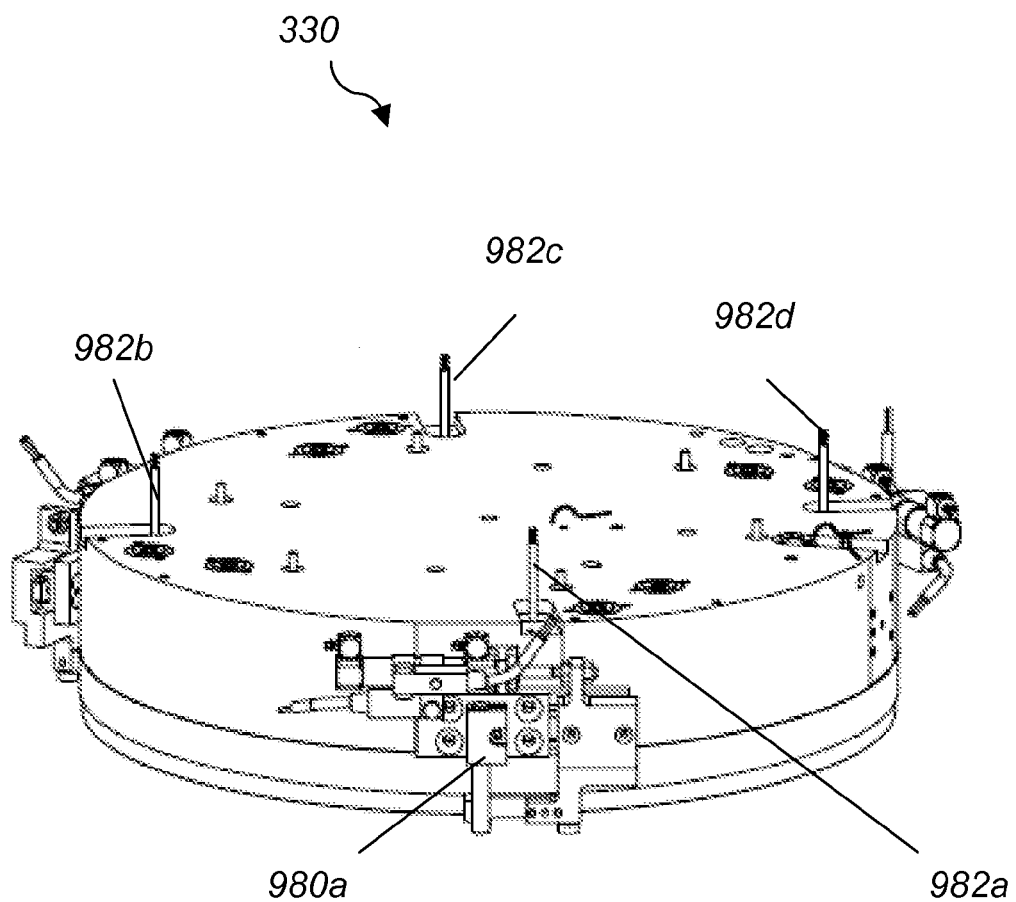
FIG. 31 is a side perspective view of the wafer heater stack of FIG. 28.

The mold 82 is transferred to the mold chuck 317 by handing off positive control of the mold 82 from the transport fixture 900. The hand-off is performed by pinning the mold against the spacers 932c with the mold transfer pins 982a, 982b, 982c and then actuating the fixture unclamping action with the fixture indexer assemblies 980a (shown in FIG. 31). The mold stack 310 is then driven to contact the mold, and the mold chuck 317 vacuum is actuated to mount the mold 82 to the mold chuck 317.

Figure 13:
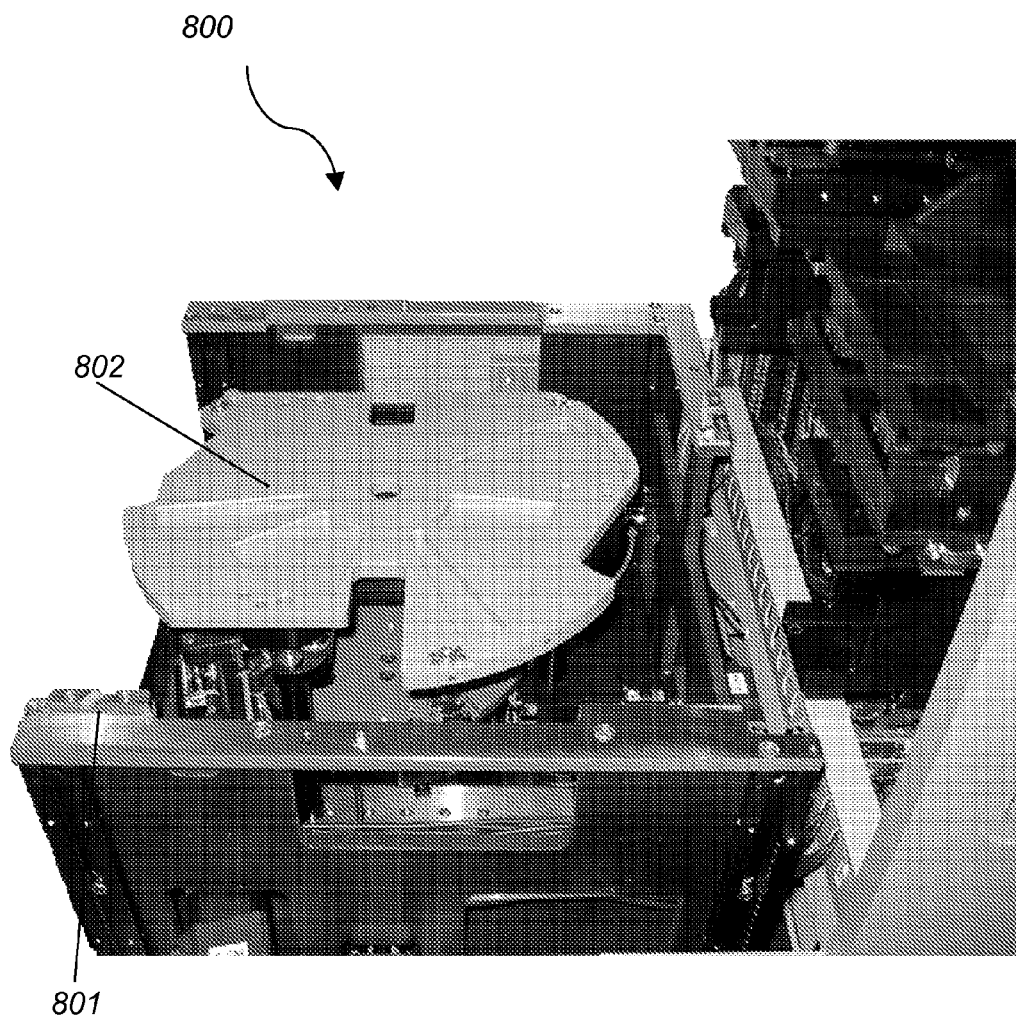
FIG. 13 depicts the HVM aligner module without the fixturing mechanisms.
Figure 14:
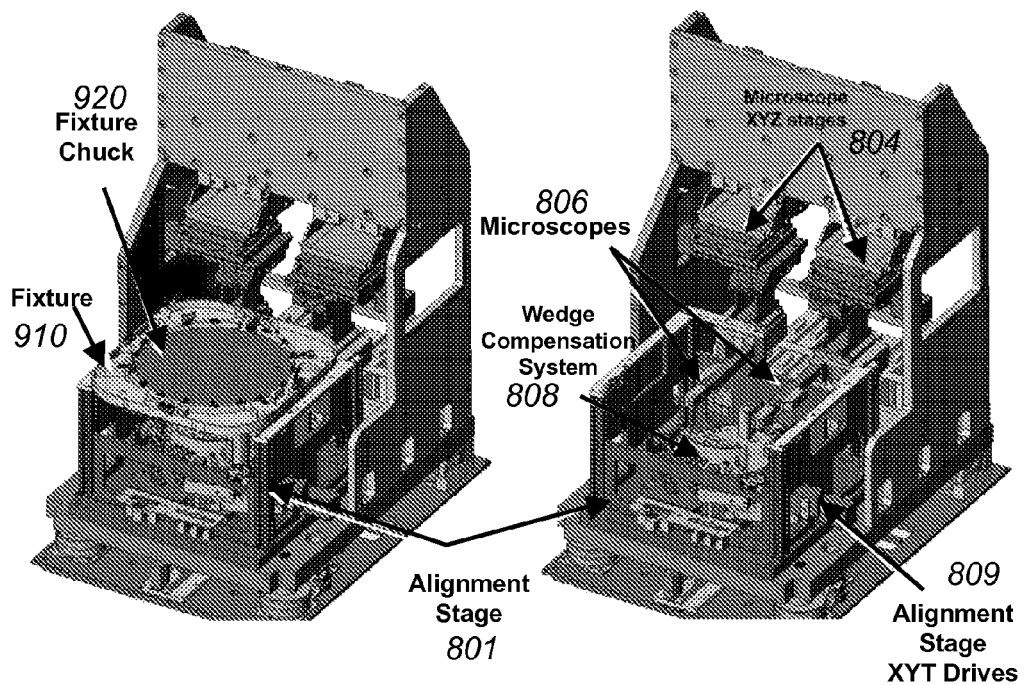
FIG. 14 depicts the HVM aligner module components with the transport fixture (left) and without the transport fixture (right)

Referring to FIG. 13 and FIG. 14, the aligner module 800 includes an alignment support frame 801, alignment stage 802 for supporting the mold/wafer transport fixture 900, two microscope XYZ stages 804, two microscopes 806, a wedge compensation system 808 and alignment stage XYT drives 809. The mold/wafer alignment process includes a mechanical pre-alignment and a pattern based image alignment. The final alignment is locked in the transport fixture 900 and is retained throughout the solder transfer process in the STT unit 301. For the alignment process, first the transport fixture 900 is loaded in the alignment stage 802 and then the mold 82 and the wafer 74 are mechanically pre-aligned in the transport fixture 900 using fiduciary markers. The wafer 74 includes a notch in its radial periphery and three marking points on its surface that are aligned with three motorized alignment pins. The mold includes three marking points that are also aligned with the three motorized alignment pins. After the mechanical pre-alignment, the wafer patterned surface and the mold surface with the solder filled cavities are imaged and the images of the wafer and mold surfaces are aligned using a pattern recognition methodology.

Prior art pattern recognition methodologies utilize unique features on object surfaces. One example of such a prior art pattern recognition methodology is the Patmax® program available from Cognex Co, Natick Mass. However, in the present case, the wafer 74 and mold 82 have homogeneous distributions of uniform (circular-shaped) and homogeneous UBM structures (pads) 73 and solder bumps 85b, respectively, and the prior art pattern recognition methodologies cannot be applied. A new process is used to define a unique wafer target area on a patterned wafer and a unique mold target area on a mold and the aligner system is trained to identify these unique wafer and mold target areas with the Patmax® program. These trained unique wafer and mold target areas are used to align the wafer/mold pairs.

Figure 33:
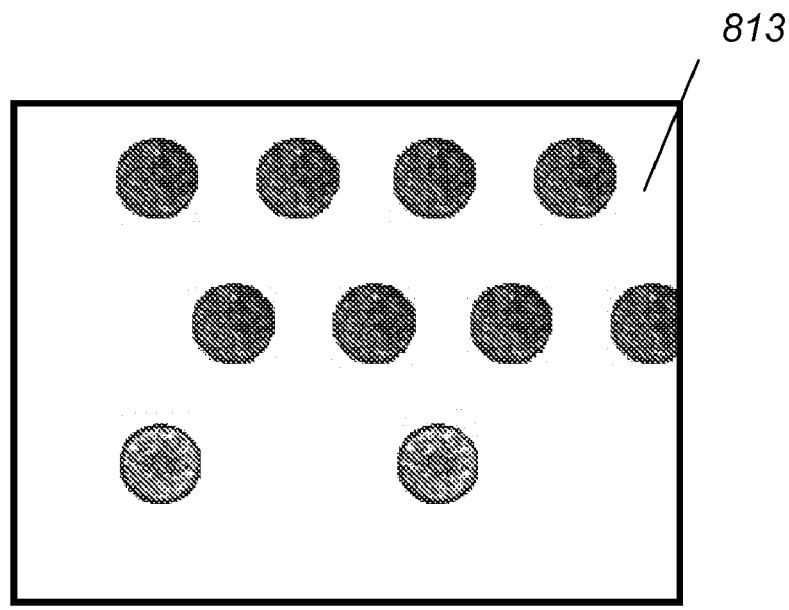
FIG. 33 is a high magnification image of a patterned surface of a semiconductor wafer.
Figure 34:
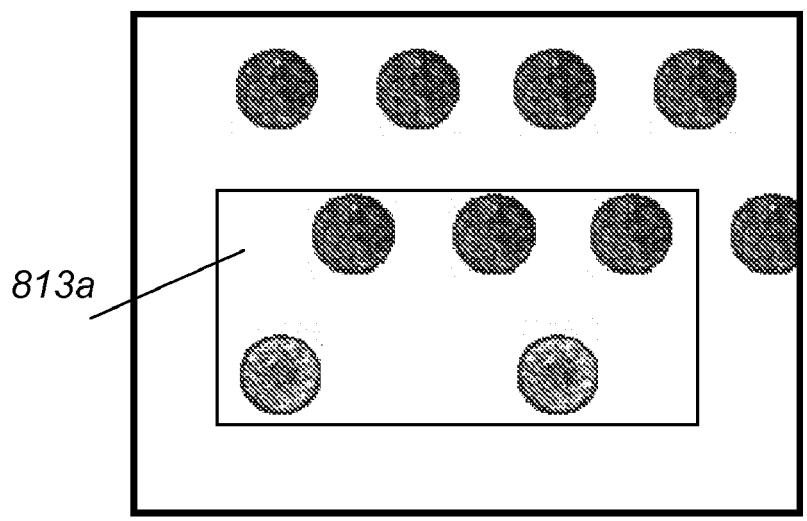
FIG. 34 depicts selecting a first target area in the image of FIG. 33 with a specific wafer pad pattern.
Figure 35:
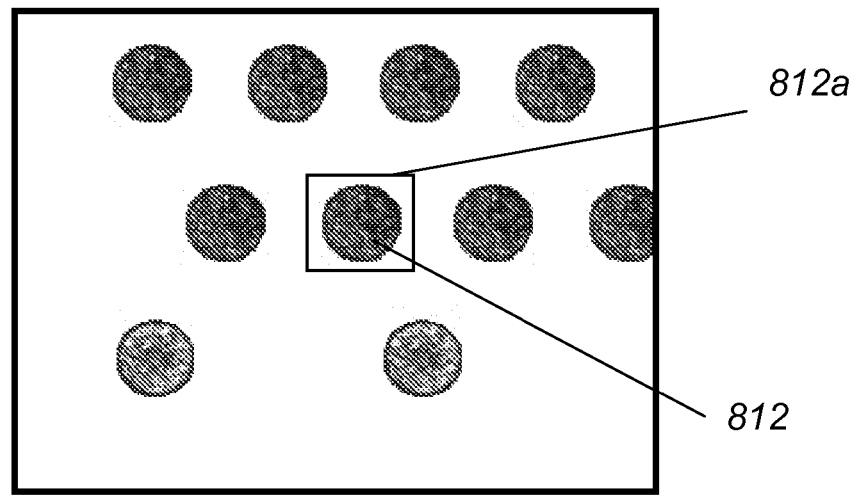
FIG. 35 depicts defining a wafer pad area around a pad in the first target area of FIG. 34.
Figure 36:
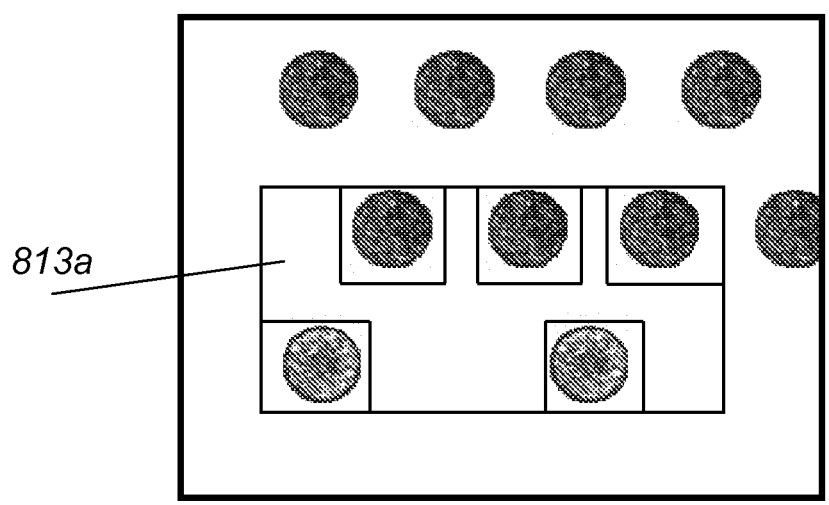
FIG. 36 depicts locating and counting all pad positions relative to the wafer target area in the first target area of FIG. 34.
Figure 47:
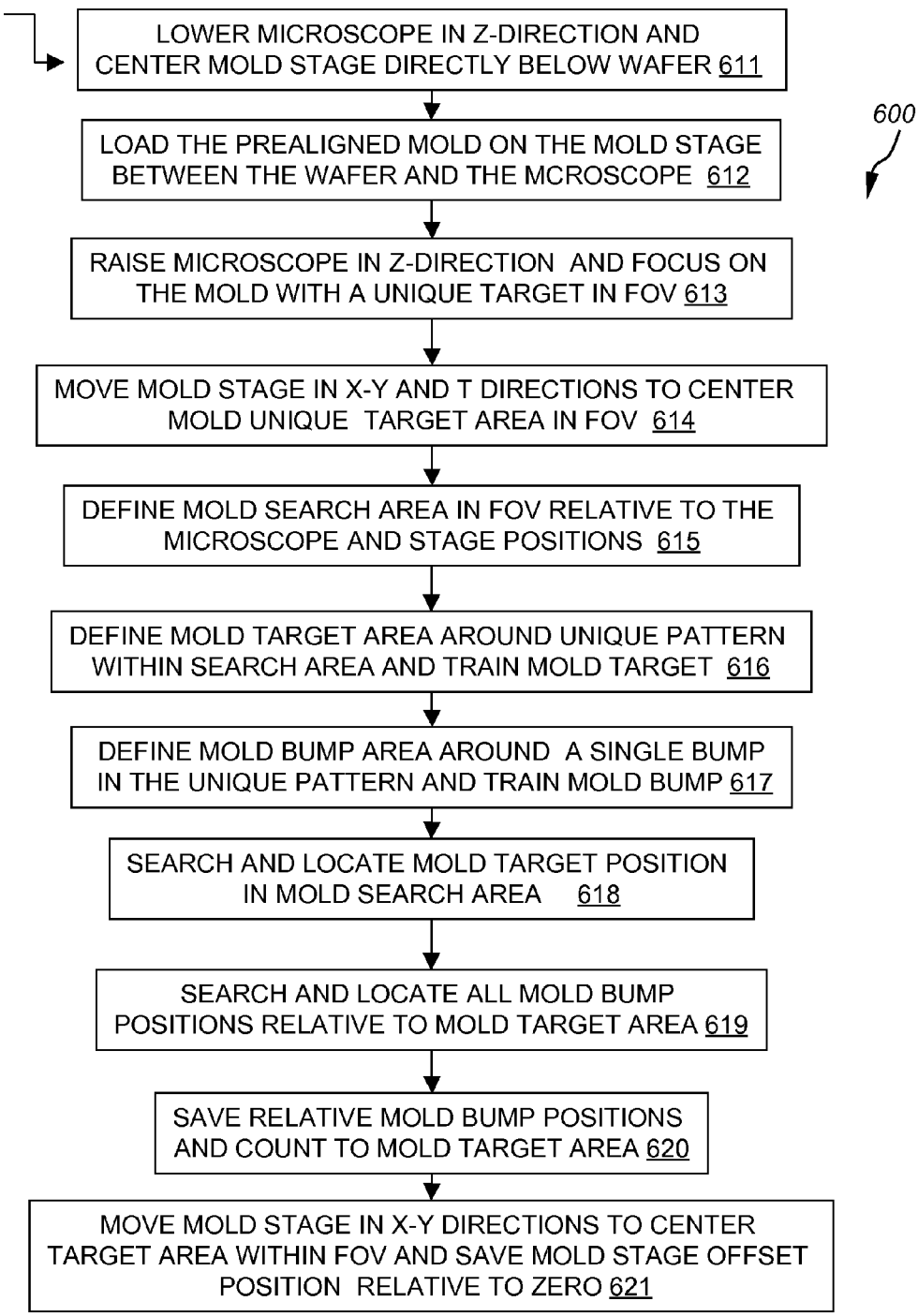
FIG. 47 depicts a block diagram of the process for identifying a unique mold target for training the alignment system.

Referring to FIG. 46 and FIG. 33 to FIG. 40, a microscope training process 600 for identifying a unique wafer target includes the following steps. First a prealigned wafer is loaded in the aligner module 800 (601). Next the microscope 806 is positioned and focused onto an area 813 of the wafer with a possible unique target in the field of view (FOV) (602), as shown in FIG. 33. The wafer search area 813 in the FOV is defined relative to the position of the microscope (603). Within the wafer search area 813, a wafer target area 813a (training target) is defined around a unique pattern of pads, as shown in FIG. 34, and the system is trained with this unique wafer target (604). Within this training wafer target 813a, a wafer pad area 812a around a single pad 812 is defined, as shown in FIG. 35, and the system is trained with this pad area (605). Next, a search is performed to locate the wafer target position within the wafer search area (606) and then all pad positions are searched and located relative to the wafer target area (607), as shown in FIG. 36. The relative wafer pad positions and number are saved to the corresponding wafer target area (608). The microscope is then moved in the X and Y directions to center the identified unique wafer target area 813a in the FOV and the position is saved relative to the wafer (609). The microscope position is locked in the X-Y plane (610). Next, the training process 600 continues with the definition of a unique mold target area on the mold and the system is trained with this mold target. Referring to FIG. 47, the microscope is lowered in the Z-direction and the mold stage is centered below the wafer (611). Next, a mold is loaded and prealigned on the mold stage between the wafer and the microscope (612) and the microscope is raised in the Z-direction and focused on the mold with a possible unique mold target in the FOV (613). The mold stage is moved in the X, Y directions and rotated around an axis perpendicular to its surface by an angle Theta (T) to center the unique mold target in the FOV (614). The mold search area in the FOV is defined relative to the microscope and stage positions (615) and a mold target area around a unique pattern of solder bumps is defined within the search area and the system is trained with this mold target (616). Within the mold target area, a mold solder bump area around a single solder bump is defined and the system is trained with this mold bump (617). Next, a search is performed to locate the mold target position within the mold search area (618) and then all mold bump positions are searched and located relative to the mold target area (619). The relative mold bump positions and number are saved to the corresponding mold target area (620). The mold stage is then moved in the X and Y directions to center the unique mold target area in the FOV and the mold stage offset position relative to zero is saved (621).

Figure 37:
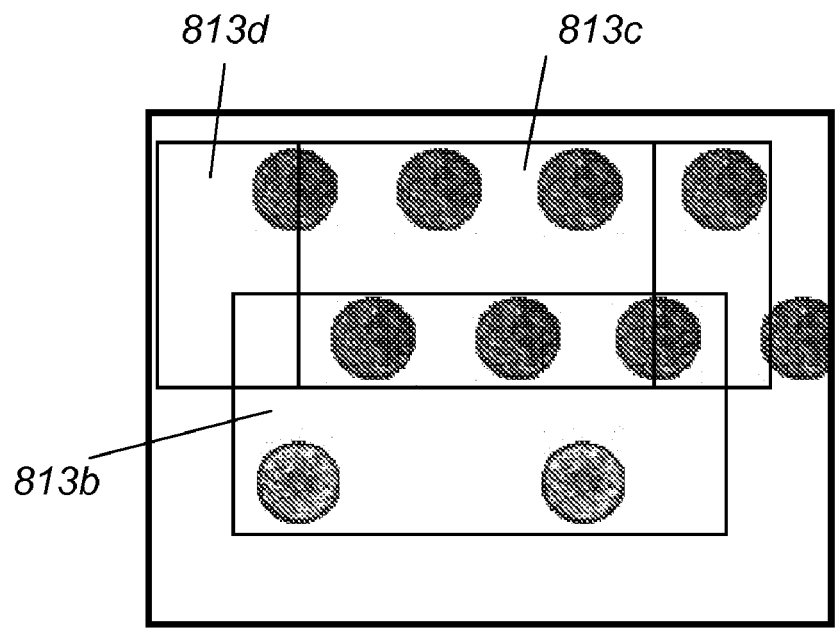
FIG. 37 depicts searching all possible target areas that match the pattern of the first target area.
Figure 38:
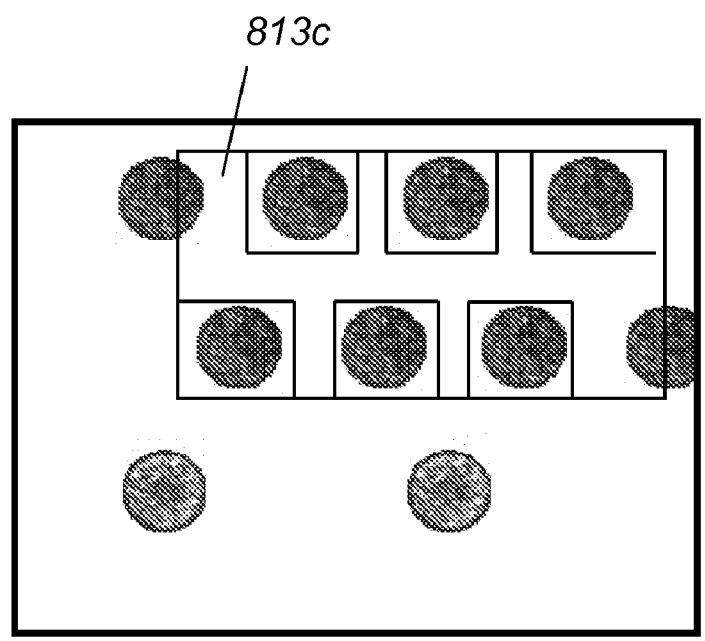
FIG. 38 depicts counting the wafer pads in all possible target areas that match the pattern of the first target area.
Figure 39:
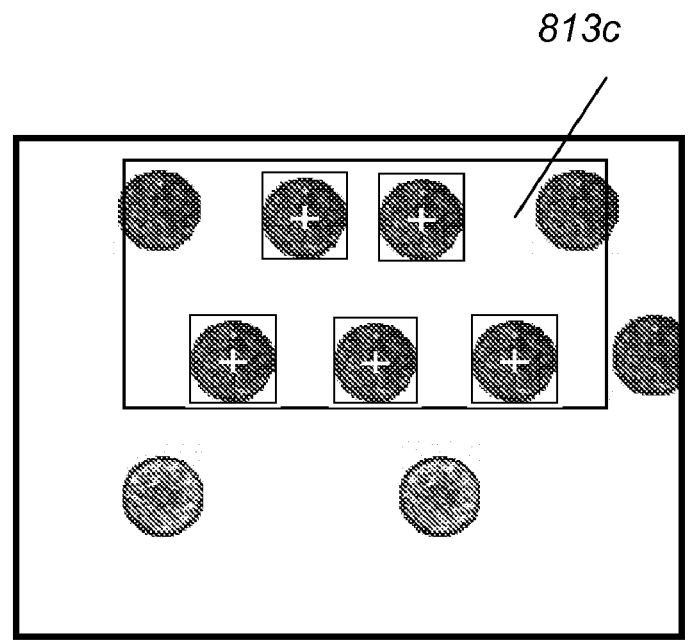
FIG. 39 depicts finding the center coordinates for all wafer pads that were counted in FIG. 38.
Figure 40:
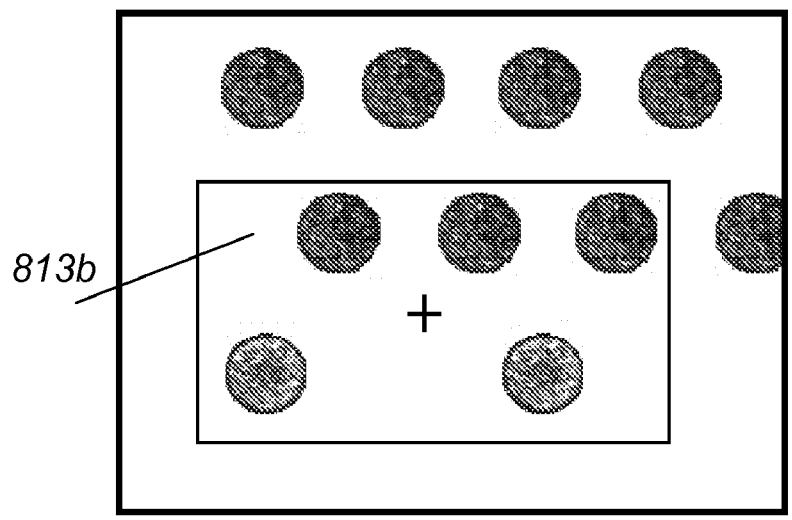
FIG. 40 depicts a preliminary target area used for training.
Figure 48:
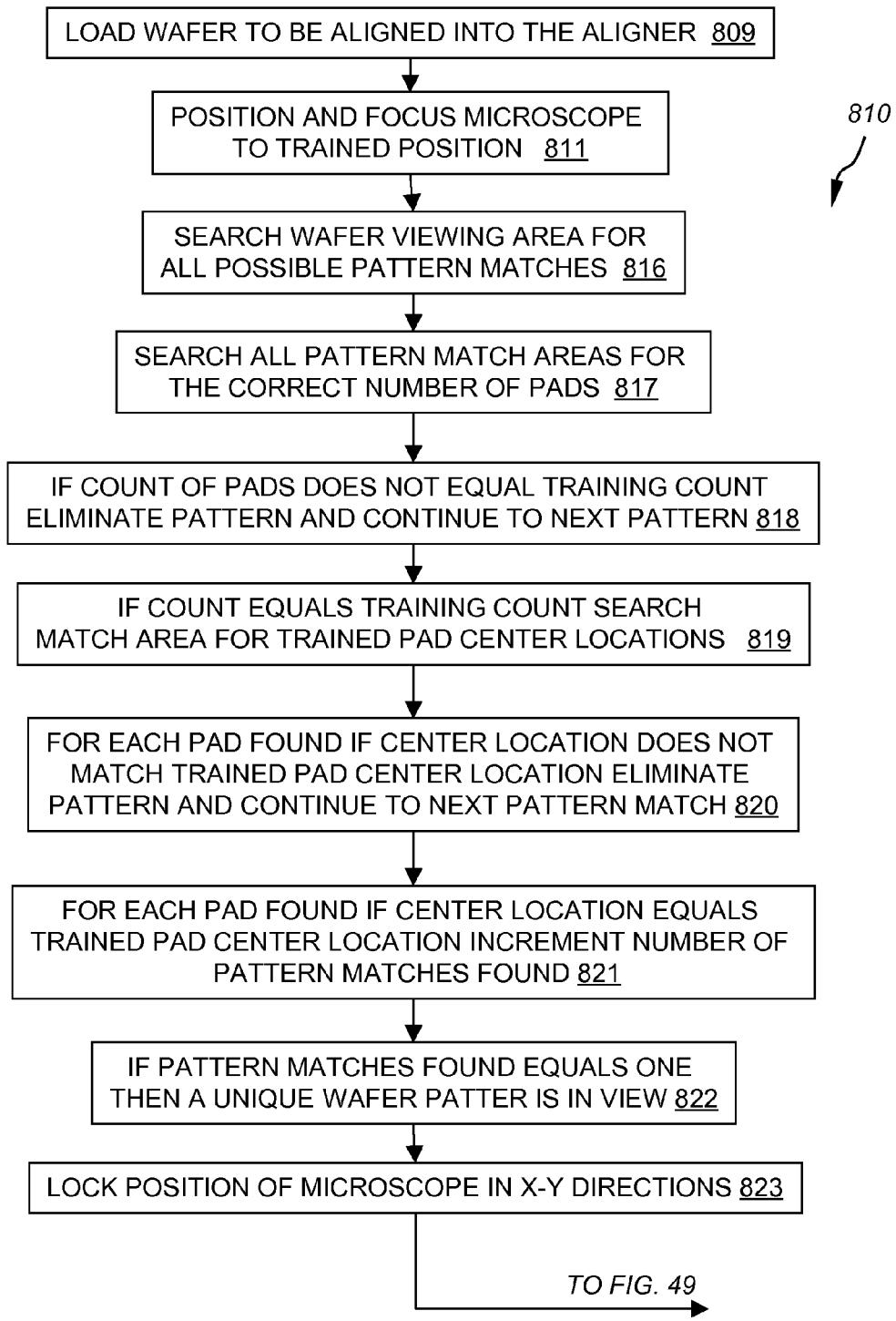
FIG. 48 depicts a block diagram of the wafer/mold alignment process utilizing the uniquely identified wafer and mold target areas.
Figure 49:
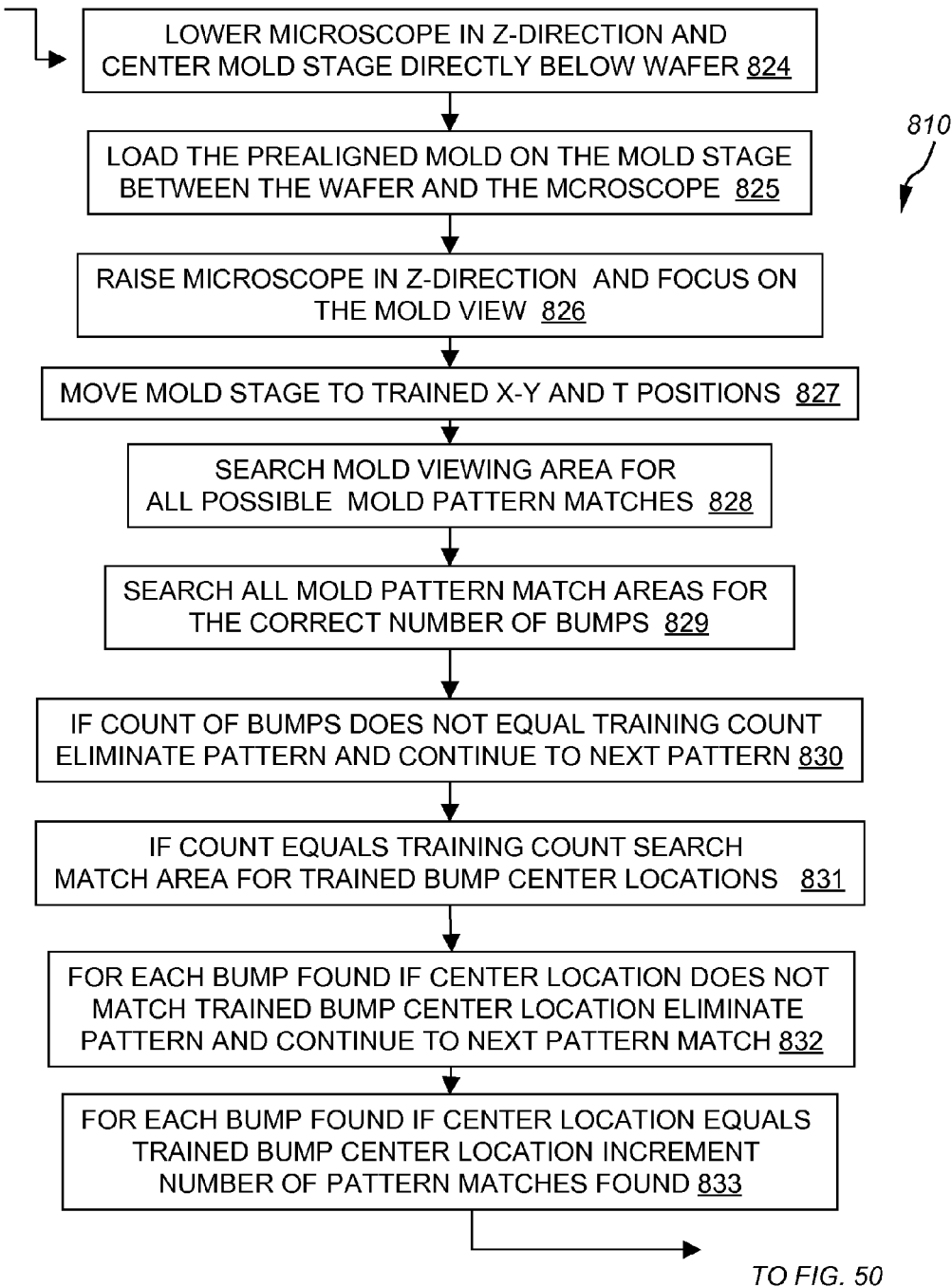
FIG. 49 is a continuation of the diagram of FIG. 48.
Figure 50:
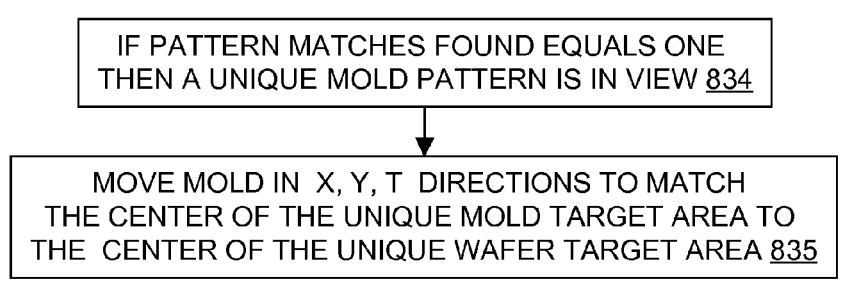
FIG. 50 is a continuation of the diagram of FIG. 49.

After the training process the system is ready to use the stored unique wafer target and unique mold target for the alignment of the wafer/mold pairs. Referring to FIG. 48 and FIG. 49, the alignment process 810 includes the following steps. First, a prealigned wafer is loaded in the aligner (809), and the microscope is positioned and focused in the trained position (811). The wafer viewing area is searched for all possible patterns 813b, 813c, 813d matching the unique wafer target pattern (816), as shown in FIG. 37. Next, the pads in all pattern match areas are searched and counted (817), as shown in FIG. 38. If the number of pads in the selected pattern does not equal the number of pads in the training target area 813a, the pattern is eliminated from consideration (818) and the next possible pattern is searched. If the number of pads in the selected pattern equals the number of pads in the training target area, the pad locations within the pattern are searched (819). For each target area whose pattern and number of pads matches the pattern and number of pads of the training target 813a, the X-Y location coordinates of the centers of all pads are identified and compared to the X-Y location coordinates of the centers of the pads of the training target 813a, as shown in FIG. 39. If the X-Y location coordinates of the pad centers do not match the X-Y location coordinates of the pad centers of the training target area, the searched patterned target area is eliminated and the next patterned target area is searched (820). If the X-Y location coordinates of the pad centers match the X-Y location coordinates of the pad centers of the training target area, the number of pattern matches found is increased by one (821). If the pattern matches found equals one, then a unique wafer target pattern is in view (822) and the microscope position is locked in the X-Y directions (823), as shown in FIG. 40. Next, the microscope is lowered in the Z-direction and the mold stage is centered directly below the wafer (824). The mold is loaded and prealigned onto the mold stage between the wafer and the microscope (825) and the microscope is raised in the Z-direction and focused on the mold view (826). Next, the mold stage is moved to the trained X-Y and T positions (827) and the mold viewing area is searched for all possible mold pattern matches (828) and each mold pattern match area is searched first for the correct number of solder bumps (829) and then for the correct solder bump center locations (831). If the number of solder bumps does not equal the number of solder bumps in the training target the pattern is eliminated and the next possible pattern match is searched (830). If the number of solder bumps equals the number of solder bumps in the training target the pattern is searched for the correct solder bump center locations (831). For each solder bump pattern if the center of each solder bump does not match the center of the trained solder bump, the pattern is eliminated and the next pattern is searched (832). For each solder bump pattern if the solder bump locations match the trained solder bump locations, the number of pattern matches found is increased by one (833). If the pattern matches found equals one, then a unique mold pattern is in view (834). Finally the mold stage is moved in the X-Y directions and rotated by an angle Theta in order to bring the center of the unique mold target area in line with the center of the unique wafer target area (835).

Figure 41:
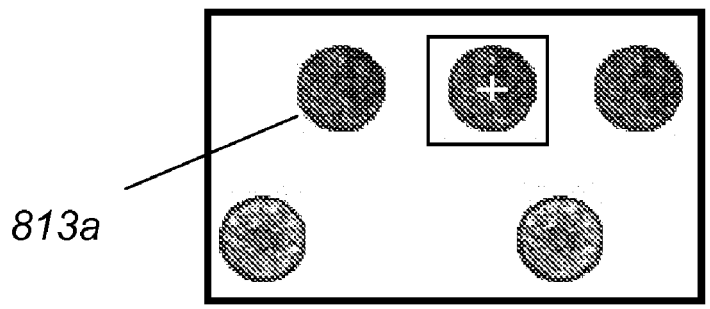
FIG. 41 depicts a first wafer pad area within the preliminary target area used for training.
Figure 42:
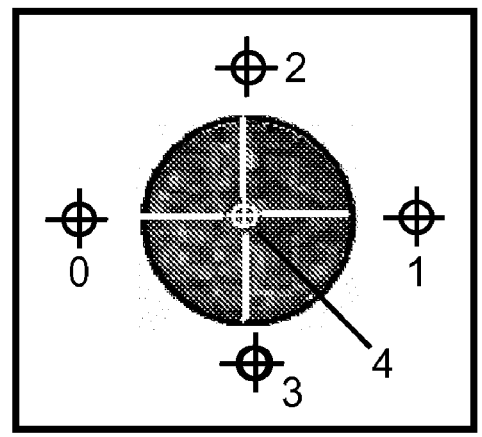
FIG. 42 depicts measuring the X and Y boundaries of the first wafer pad area of FIG. 41.
Figure 43:
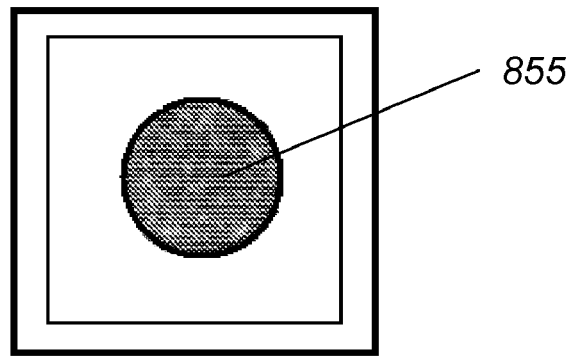
FIG. 43 depicts building a wafer pad mask covering 90% of the first wafer pad area of FIG. 41.
Figure 44:
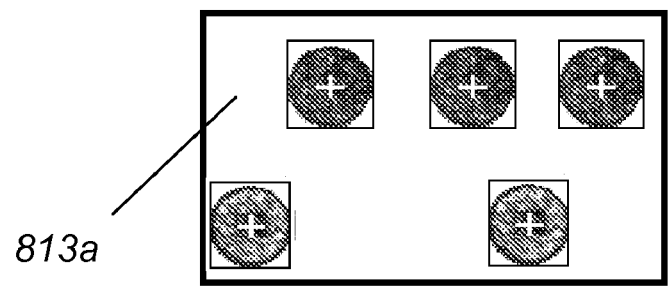
FIG. 44 depicts placing the wafer pad mask of FIG. 43 on the wafer pads in the preliminary target area of FIG. 40.
Figure 45:
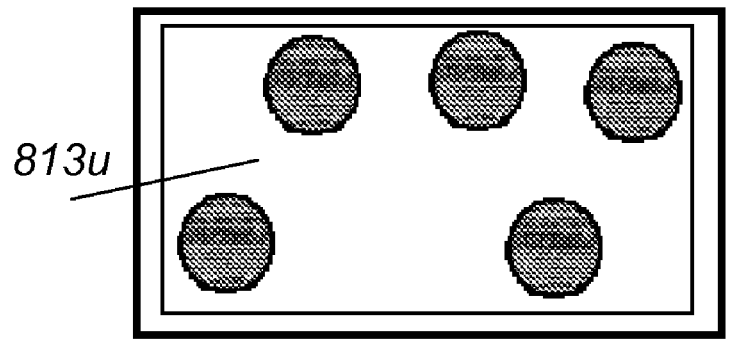
FIG. 45 depicts a unique wafer target area used for the alignment process.
Figure 46:
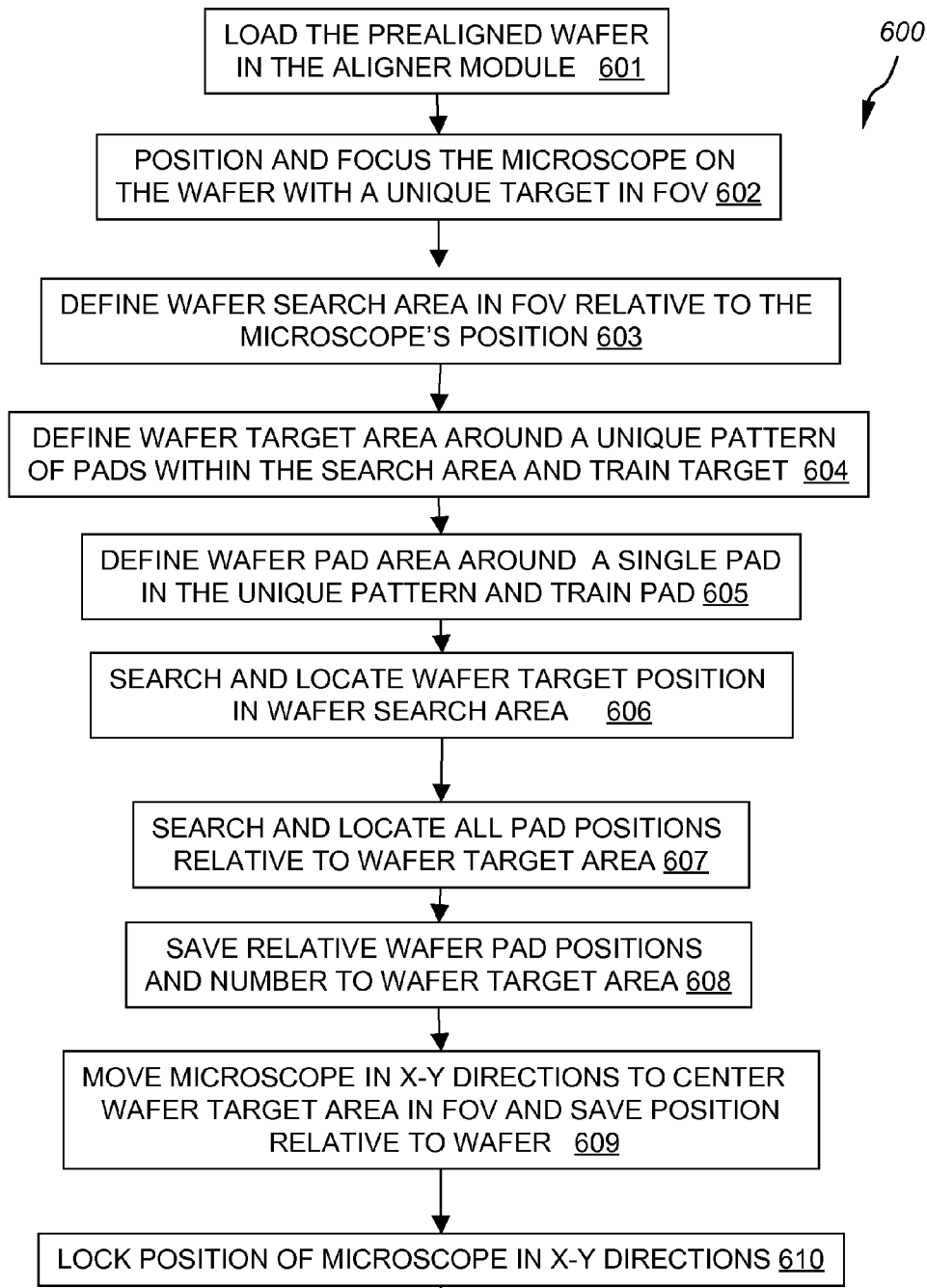
FIG. 46 depicts a block diagram of the process for identifying a unique wafer target for training the alignment system.
Figure 51:
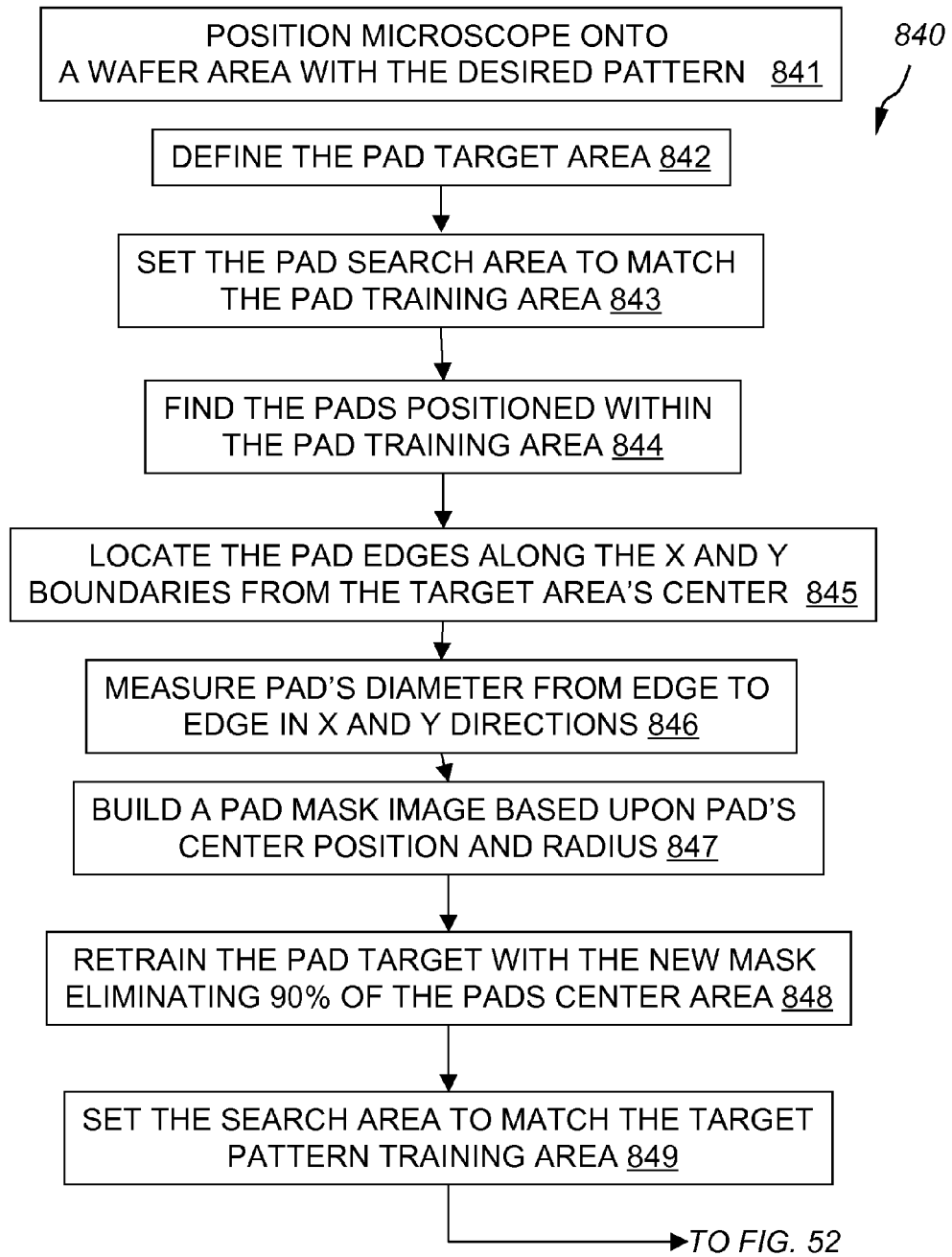
FIG. 51 depicts a block diagram of another embodiment for the process for identifying a unique wafer target for training the alignment system utilizing a mask.
Figure 52:
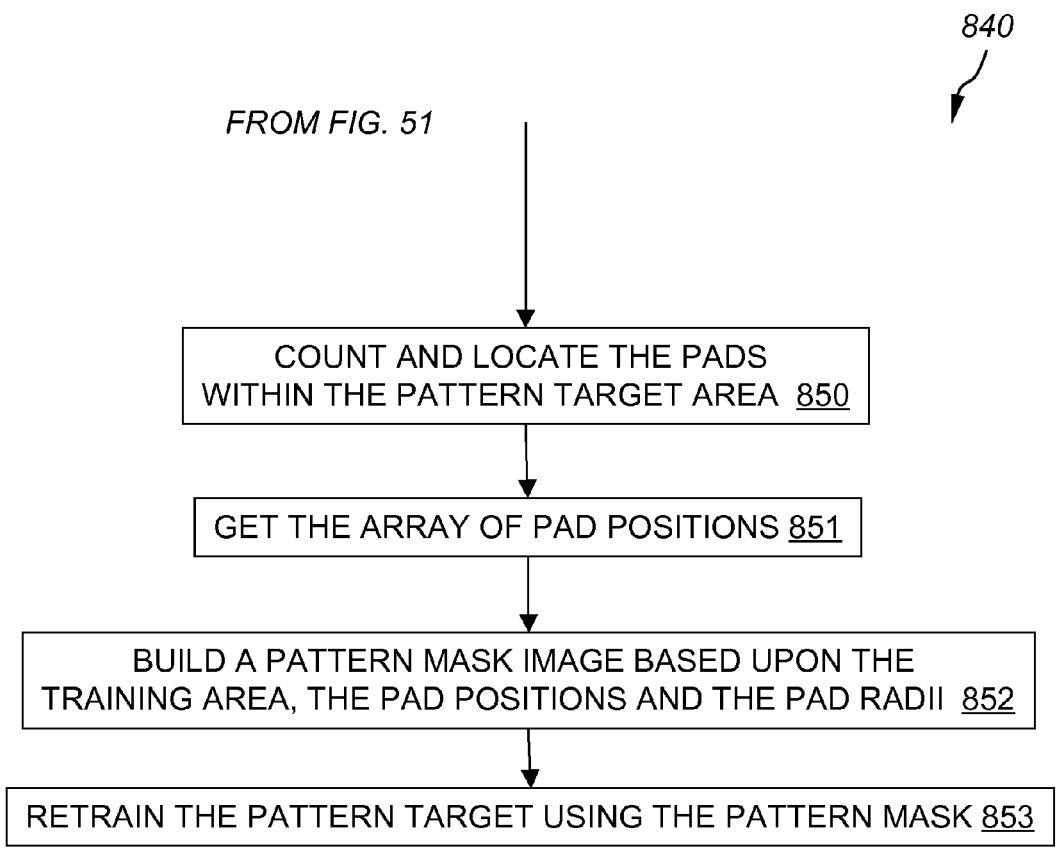
FIG. 52 is a continuation of FIG. 51.

In another embodiment, an improved wafer/mold pattern recognition utilizes an automated mask generation for identifying ambiguous circular-shaped pads or solder bumps. Referring to FIG. 51-52, the process of training the system with a patterned mask 840 includes the following steps. First the microscope is positioned onto a wafer (or mold) area to define a search location containing the desired pattern (841), as was shown in FIG. 33. Within this pattern area, the pad target area 813a is defined (842), and the pad search area is set to match the pad training area (843), as shown in FIG. 41. Next the pads positioned within the pad training area 813a are identified (844) and the edges of each pad are located (845), as shown in FIG. 42. Next, the pad diameters in the X and Y directions are measured (846), and the pad dimensions are used to design a mask image based on the pad's center position and radius (847). Next, the pad target is retrained with the new mask 855 eliminating 90% of the pads center area (848), as shown in FIG. 43. Next, the search area is set to match the target pattern training area (849), the pads within the pattern target are located and counted (850) and an array of pad positions is obtained (851), as shown in FIG. 44. Next, a pattern mask image is built based upon the training area, the pad positions and the pad radii (852) and then the pattern target is retrained using the pattern mask (853), as shown in FIG. 45. The pattern mask image 813u is used for the image alignment process, as was described above.

Among the advantages of this invention may be one or more of the following. The mold chuck and wafer chuck provide uniform heat transfer to the mold and wafer respectively. Mold heater plate and wafer heater plate are made of ceramics that have a CTE matching the CTE of the mold and the wafer, respectively. A thermal expansion barrier material prevents warping of the mold stack and heater stack materials and ultimately of the molds and wafer. The cooling flanges prevent heat from escaping to the frame. The mold/wafer alignment is set at the aligner and then retained throughout the entire solder transfer process.

Several embodiments of the present invention have been described. Nevertheless, it will be understood that various modifications may be made without departing from the spirit and scope of the invention. Accordingly, other embodiments are within the scope of the following claims.

What is claimed is:

1. A method for forming solder bumps onto semiconductor structures comprising:
    filling patterned mold cavities formed on a first surface of a mold structure with solder;
    positioning and aligning a patterned first surface of a semiconductor structure directly opposite to said solder filled patterned mold cavities of the mold structure wherein said aligning comprises
        aligning at least one motorized alignment pin with a first fiduciary marker on said mold structure and with a first fiduciary marker on said semiconductor structure; and
        performing a pattern based alignment comprising identifying a mold training pattern image and a semiconductor training pattern image on a training mold structure and a training semiconductor structure, respectively, training said alignment tool with said training pattern images, storing said alignment tool trained position, identifying a mold pattern image and a semiconductor pattern image on said mold structure and said semiconductor structure matching said mold training pattern image and said semiconductor training pattern image, respectively, and aligning said identified mold pattern image with said identified semiconductor pattern image;
    providing a fixture tool for holding and transferring said aligned mold and semiconductor structures together; and
    inserting said fixture tool with the aligned mold and semiconductor structures into solder transfer equipment and transferring the solder from said aligned patterned mold cavities to said aligned patterned semiconductor first surface.

2. The method of claim 1 wherein said solder transfer equipment comprises:
    a wafer heater stack configured to heat said semiconductor structure;
    a mold heater stack configured to heat said mold structure to a process temperature slightly above said solder's melting point;
    wherein said fixture tool with said aligned mold and semiconductor structures is inserted between said wafer heater stack and said mold heater stack so that a second surface opposite to said first surface of said substrate is in contact with said wafer heater stack and a second surface opposite to said first surface of said mold structure is in contact with said mold heater stack; and
    wherein a deposition chamber is formed between said wafer heater stack and said mold heater stack by sealing said wafer heater stack and said mold heater stack against said frame.

3. The method of claim 1 wherein said fixture tool comprises a frame having a central aperture dimensioned to support a substrate and wherein a second surface opposite to said patterned first surface of said semiconductor structure is brought in contact with a first surface of said substrate.

4. The method of claim 3 wherein said fixture tool further comprises one or more clamp/spacer assemblies arranged symmetrically around said frame, each clamp/spacer assembly comprising a clamp configured to clamp said mold and semiconductor structures together and a spacer configured to be inserted between said first surface of said semiconductor structure and said first surface of said mold structure and thereby to separate said mold and semiconductor structures by a distance equal to said spacer's height.

5. A method for positioning and aligning a patterned surface of a first semiconductor structure directly opposite to a patterned surface of a second semiconductor structure comprising performing a pattern based alignment comprising:
    defining first and second training pattern images on first and second training semiconductor structures, respectively;
    training said alignment tool with said first and second training pattern images;
    locating said training pattern images;
    storing said alignment tool trained position;
    identifying first and second semiconductor pattern images on patterned surfaces of said first and second semiconductor structures matching said first and second training pattern images, respectively; and
    aligning centers of said identified first and second semiconductor pattern images.

6. The method of claim 5 wherein said defining first and second training pattern images on first and second training semiconductor structures comprise defining a target area around a unique pattern of elements and defining an area around each element.

7. The method of claim 6 wherein said training said alignment tool comprises running an automatic pattern recognition application.

8. The method of claim 7 wherein said automatic pattern recognition application comprises a Patmax application.

9. The method of claim 7 wherein said locating said training pattern image comprises locating said training pattern image position within a semiconductor structure search area, counting all elements within said training pattern image and locating all elements' positions within said training pattern image.

10. The method of claim 9 wherein said identifying said semiconductor pattern images on patterned surfaces of said semiconductor structures matching said training pattern images comprise matching pattern areas, number of elements within the pattern areas and positions of elements within the pattern areas.

11. The method of claim 10 further comprising designing a mask image based on said elements' center positions and dimensions and training said alignment tool with a pattern mask image comprising said elements masked by said mask image.

12. The method of claim 5 further comprising aligning at least one motorized alignment pin with a first fiduciary marker on said first semiconductor structure and with a first fiduciary marker on said second semiconductor structure.

* * * * *